(12) United States Patent
Balakrishnan et al.

(10) Patent No.: US 10,170,469 B2
(45) Date of Patent: Jan. 1, 2019

(54) VERTICAL FIELD-EFFECT-TRANSISTORS HAVING MULTIPLE THRESHOLD VOLTAGES

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/498,669

(22) Filed: Apr. 27, 2017

(65) Prior Publication Data

US 2017/0229449 A1 Aug. 10, 2017

Related U.S. Application Data

(63) Continuation of application No. 14/964,097, filed on Dec. 9, 2015, now Pat. No. 9,716,155.

(51) Int. Cl.
*H01L 29/00* (2006.01)
*H01L 27/088* (2006.01)
*H01L 29/78* (2006.01)
*H01L 29/08* (2006.01)
(Continued)

(52) U.S. Cl.
CPC ........ *H01L 27/088* (2013.01); *H01L 23/5226* (2013.01); *H01L 23/5283* (2013.01); *H01L 29/0847* (2013.01); *H01L 29/7827* (2013.01)

(58) Field of Classification Search
CPC .............. H01L 29/0847; H01L 29/785; H01L 27/0886
See application file for complete search history.

(56) References Cited

U.S. PATENT DOCUMENTS 4,941,027 A 7/1990 Beasom
5,427,964 A 6/1995 Kaneshiro et al.
(Continued)

OTHER PUBLICATIONS

Non-Final Office Action dated Nov. 23, 2016, received for U.S. Appl. No. 14/964,097.
List of IBM Patents or Patent Applications Treated as Related.

*Primary Examiner* — Thao P Le
(74) *Attorney, Agent, or Firm* — Fleit Gibbons Gutman Bongini Bianco PL; Thomas S. Grzesik

(57) ABSTRACT

Various embodiments disclose a method for fabricating a semiconductor structure including a plurality of vertical transistors each having different threshold voltages. In one embodiment the method includes forming a structure having at least a substrate, a source contact layer on the substrate, a first spacer layer on the source contact layer, a replacement gate on the first spacer layer, a second spacer layer on the replacement gate, and an insulating layer on the second spacer layer. A first trench is formed in a first region of the structure. A first channel layer having a first doping concentration is epitaxially grown in the first trench. A second trench is formed in a second region of the structure. A second channel layer having a second doping concentration is epitaxially grown in the second trench. The second doping concentration is different from the first doping concentration.

17 Claims, 21 Drawing Sheets

(51) Int. Cl.
*H01L 23/528* (2006.01)
*H01L 23/522* (2006.01)

(56) References Cited

U.S. PATENT DOCUMENTS

| | | | |
|---|---|---|---|
| 5,687,355 | A | 11/1997 | Joardar et al. |
| 5,963,799 | A * | 10/1999 | Wu ................. H01L 21/823892 257/E21.644 |
| 6,670,990 | B1 * | 12/2003 | Kochi ............... H01L 27/14609 348/310 |
| 6,943,396 | B2 * | 9/2005 | McNeil ............... H01L 27/0255 257/301 |
| 9,960,271 | B1 * | 5/2018 | Xie .................... H01L 29/7827 |
| 2002/0179950 | A1 | 12/2002 | Hijzen et al. |
| 2003/0168680 | A1 * | 9/2003 | Hsu ....................... H01L 27/108 257/296 |
| 2005/0128804 | A1 | 6/2005 | Forbes |
| 2006/0192249 | A1 * | 8/2006 | Kim ................ H01L 21/823437 257/330 |
| 2009/0212854 | A1 * | 8/2009 | Baumgartner ...... H01L 29/4238 327/543 |
| 2013/0187196 | A1 * | 7/2013 | Kadow ................. H01L 27/088 257/140 |
| 2014/0027854 | A1 | 1/2014 | Asenov |
| 2014/0042535 | A1 * | 2/2014 | Darwish ............. H01L 29/7395 257/334 |
| 2014/0176228 | A1 | 6/2014 | Giraud et al. |
| 2016/0211346 | A1 | 7/2016 | Shifren et al. |
| 2016/0233224 | A1 * | 8/2016 | Rhie ................. H01L 27/11582 |
| 2017/0170287 | A1 * | 6/2017 | Balakrishnan ...... H01L 29/7827 |
| 2017/0256641 | A1 | 9/2017 | Meiser |
| 2018/0033639 | A1 * | 2/2018 | Jung ................. H01L 21/30655 |

\* cited by examiner

VERTICAL FIELD-EFFECT-TRANSISTORS HAVING MULTIPLE THRESHOLD VOLTAGES

BACKGROUND OF THE INVENTION

The present disclosure generally relates to the field of semiconductors, and more particularly relates to vertical field-effect-transistors.

Vertical transistors are a promising option for technology scaling for 5 nm and beyond. Multiple threshold voltage devices are important so power/performance tradeoff can be tuned in circuit design. However, achieving multiple threshold voltage devices for a vertical field-effect-transistor is challenging due to the difficulty in introducing channel dopants.

SUMMARY OF THE INVENTION

In one embodiment, a method for fabricating a semiconductor structure comprising a plurality of vertical transistors with different threshold voltages is disclosed. The method comprises forming a structure having at least a substrate, a source contact layer on the substrate, a first spacer layer on the source contact layer, a replacement gate on the first spacer layer, a second spacer layer on the replacement gate, and an insulating layer on the second spacer layer. A first trench is formed in a first region of the structure. The first trench extends from a top surface of the insulating layer down to a top surface of the source contact layer. A first channel layer having a first doping concentration is epitaxially grown up from the top surface of the source contact layer, where the first channel layer fills the first trench. A second trench is formed in a second region of the structure. The second trench extends from the top surface of the insulating layer down to the top surface of the source contact layer. A second channel layer having a second doping concentration is epitaxially grown up from the top surface of the source contact layer, where the second channel layer filling the second trench. The second doping concentration is different than the first doping concentration.

In another embodiment, a semiconductor structure is disclosed. The semiconductor structure comprises a first vertical field-effect transistor comprising a first threshold voltage, and at least a second vertical field-effect transistor comprising a second threshold voltage that is different from the first threshold voltage.

In yet another embodiment, an integrated circuit is disclosed. The integrated circuit comprises a semiconductor structure. The semiconductor structure comprises a first vertical field-effect transistor comprising a first threshold voltage, and at least a second vertical field-effect transistor comprising a second threshold voltage that is different from the first threshold voltage.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
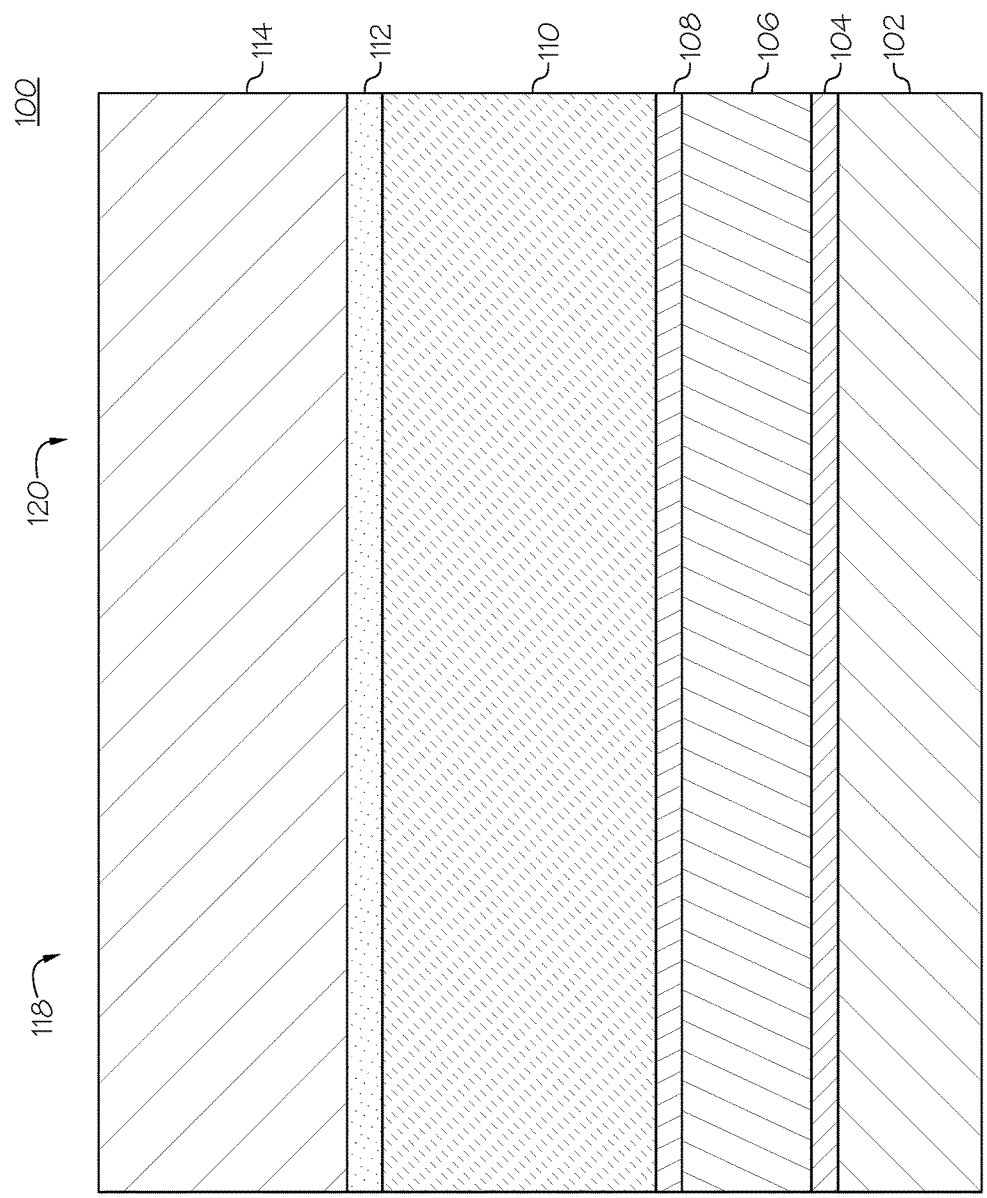
FIG. 1 is a cross-sectional view of an initial semiconductor structure according to one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-20 illustrate various processes for fabricating vertical field-effect-transistors (FETs) comprising multiple threshold voltages. FIG. 1 shows a partially fabricated semiconductor device 100 comprising a substrate 102, a counter-doped layer 104, a source contact layer 106, a first (bottom) spacer layer 108, a replacement (dummy) gate 110, a second (top) spacer layer 112), and a dielectric capping layer 114. FIG. 1 also shows a first voltage threshold region (VT1) 118 and at least a second voltage threshold (VTN) 120 of the structure 100. In one embodiment, an nFET of pFET device in each of these regions 118, 120 with different threshold voltages.

The thickness of the substrate 102 can be, for example, from 50 microns to 1,000 microns, although lesser and greater thicknesses can be employed as well. The substrate 102 can be single crystalline and or a bulk substrate, a semiconductor-on-insulator (SOT) substrate, or a hybrid substrate. An insulator layer (not shown) comprising a dielectric material such as silicon oxide, silicon nitride, silicon oxynitride, or any combination thereof can be formed on an in contact with the substrate 102.

The substrate 102 can be appropriately doped either with p-type dopant atoms or with n-type dopant atoms, or the material can be substantially undoped (intrinsic). The dopant concentration of the substrate 102 can be from $1.0 \times 10^{15}/cm^3$ to $1.0 \times 10^{19}/cm^3$, and in one embodiment, is from $1.0 \times 10^{16}$ cm$^3$ to $3.0 \times 10^{18}/cm^3$, although lesser and greater dopant concentrations are applicable as well. The counter-doped layer 104 is formed on an in contact with the substrate 102 (or a buried insulator layer if formed). The counter-doped layer 104 is formed by an epitaxial growth of a semiconductor material. The counter-doped layer can then be implanted with dopants and annealed using, for example, rapid thermal anneal. Alternatively, the counter-doped layer can be doped in-situ during the epitaxial growth. The purpose of the counter-doped layer is to provide an isolation between one transistor and the next transistor. The source contact layer 106 is formed on and in contact with the counter-doped layer 104. The source contact 106 can be, for example, an n++ doped region of the substrate 102 and can have a thickness in a range of, for example, about 10 nm to about 200 nm. However, other thicknesses are applicable as well. The source contact region can be formed by epitaxial growth.

The first spacer 108 is formed on and in contact with the source layer 106. The spacer 108 comprises a dielectric material (such as silicon oxide, silicon nitride, silicon oxynitride, or a combination of these) and can be formed using any conventional deposition process such as, for example, chemical vapor deposition (CVD). The replacement gate 110 is formed on and in contact with the first spacer 110 and comprises a single layer or multiple layers of oxide, polysilicon, amorphous silicon, nitride, or a combination thereof. The replacement gate 110 can be formed by CVD processes, thermal oxidation, or wet chemical oxidation. This replacement gate stack acts as a place holder for the actual gate stack to be formed after formation of the channel material for the device(s).

The second spacer 112 is formed on and in contact with the replacement gate 110. The spacer 112 comprises a dielectric material (such as silicon oxide, silicon nitride, silicon oxynitride, or a combination of these) and can be formed using any conventional deposition process such as, for example, CVD. The first and second spacers 108, 112 can comprise the same or different materials. The dielectric capping layer 114 is formed on and in contact with the second spacer 112 and comprises, for example, silicon dioxide. The dielectric capping layer is a sacrificial layer and comprises a different dielectric material than the top spacer dielectric. The purpose of the dielectric capping layer 114 is to enable further processing.

Figure 2:
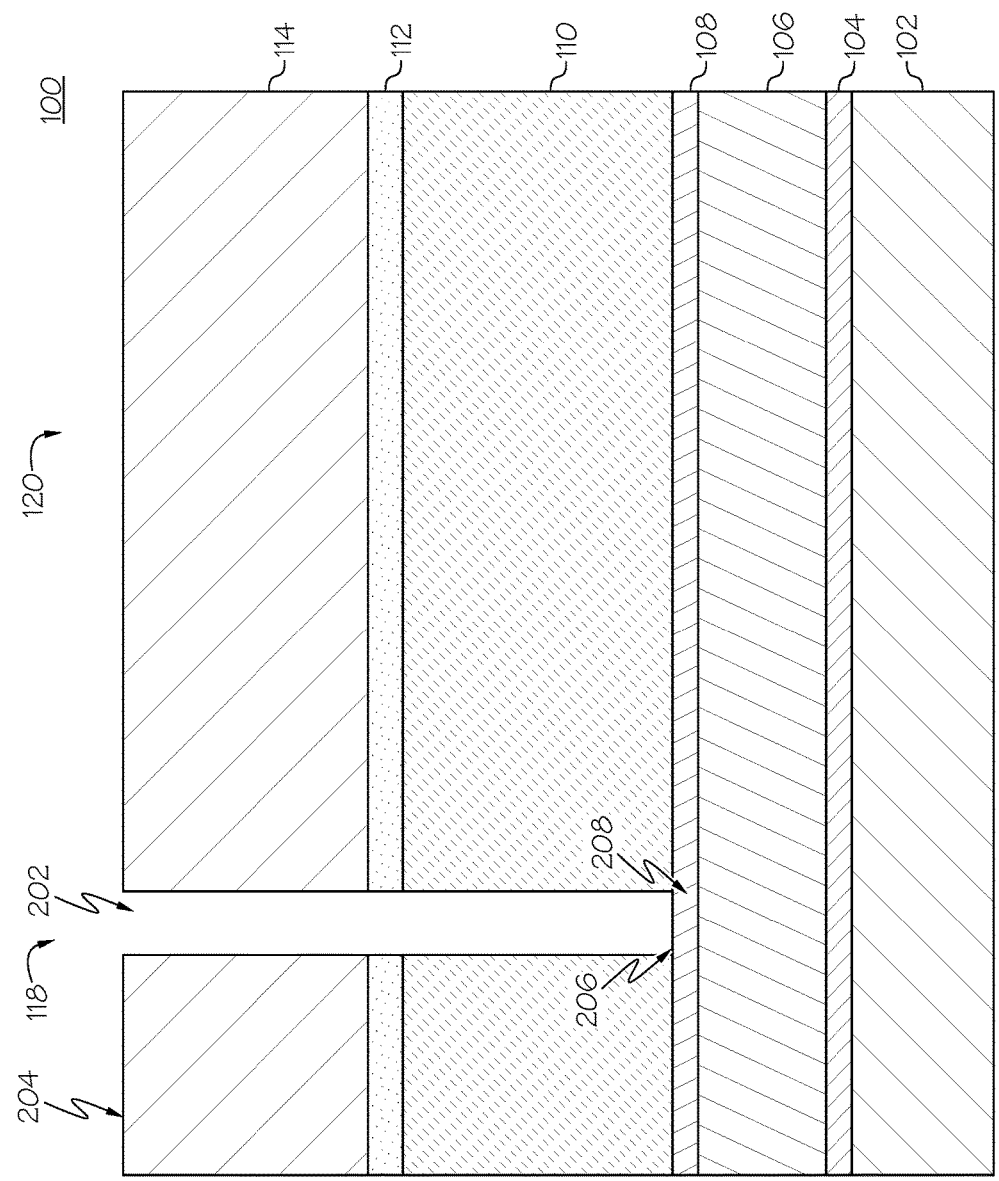
FIG. 2 is a cross-sectional view of the semiconductor structure after a first trench has been formed in a first region of the semiconductor structure according to one embodiment of the present disclosure.
Figure 3:
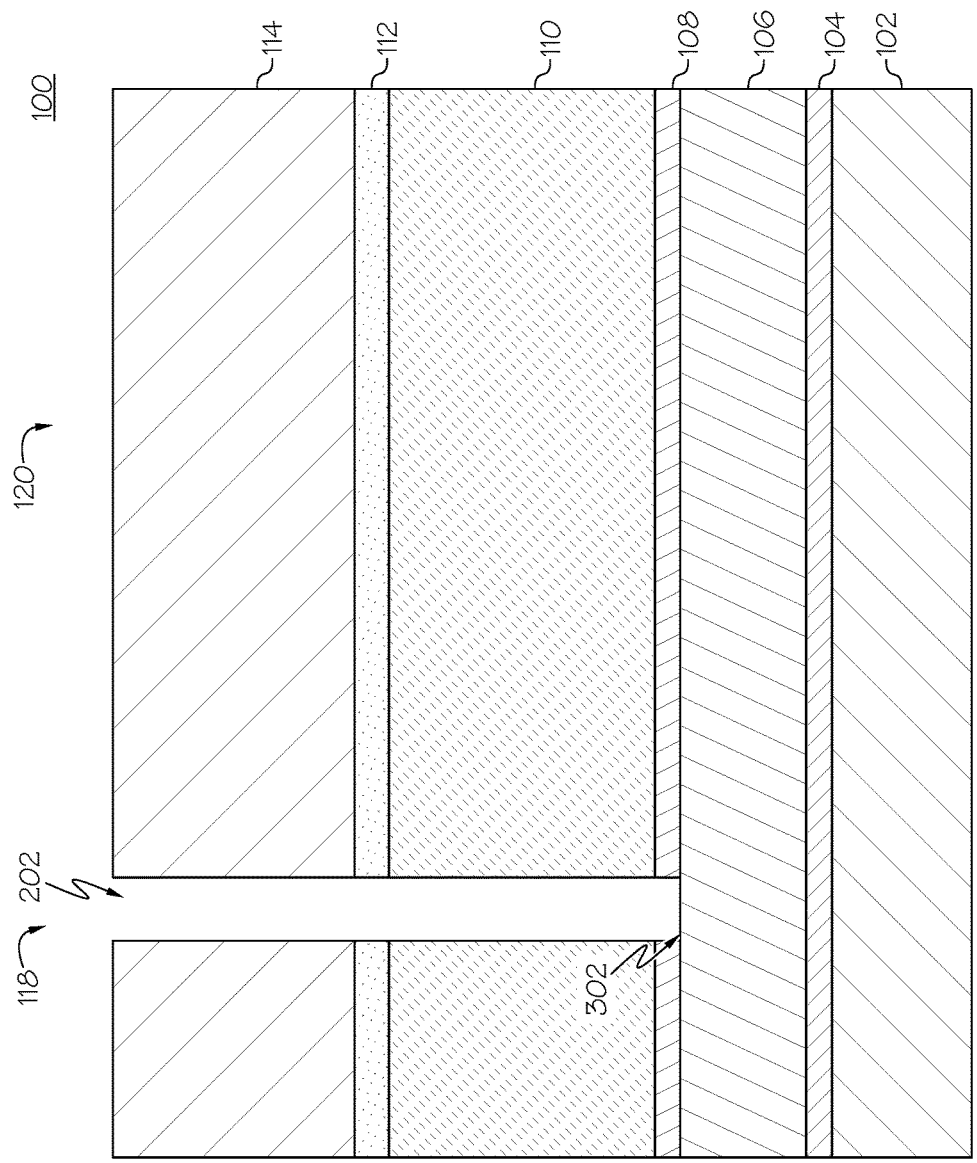
FIG. 3 is a cross-sectional view of the semiconductor structure after a portion of a bottom spacer layer exposed within the first trench has been removed according to one embodiment of the present disclosure.

FIG. 2 shows that multiple etching processes are performed to form an opening/trench 202 within the structure 100 after the structure 100 shown in FIG. 1 has been formed. For example, a first etching process is performed to remove a portion of the dielectric capping layer 114 selective to the material of the second spacer 112. A second etching process is then performed to remove a portion of the second spacer 112, which underlies the portion of the trench 202 formed from the first etching process, selective to the material of the replacement gate 110. A third etching process is then performed to remove a portion of the replacement gate 110, which underlies the portion of the trench 202 formed from the second etching process, selective to the material of the first spacer 106. The resulting trench 202 extends through a top surface 204 of the dielectric capping layer 114 down to a top surface 206 of an exposed portion 208 of the first spacer 108. The exposed portion 208 of the first spacer 108 is then removed by an etching process to expose a portion 302 of the underlying source contact layer 106, as shown in FIG. 3. This creates a self-aligned junction because a source extension can be epitaxially grown from the source layer 104 to a top surface of the first spacer layer 108.

Figure 4:
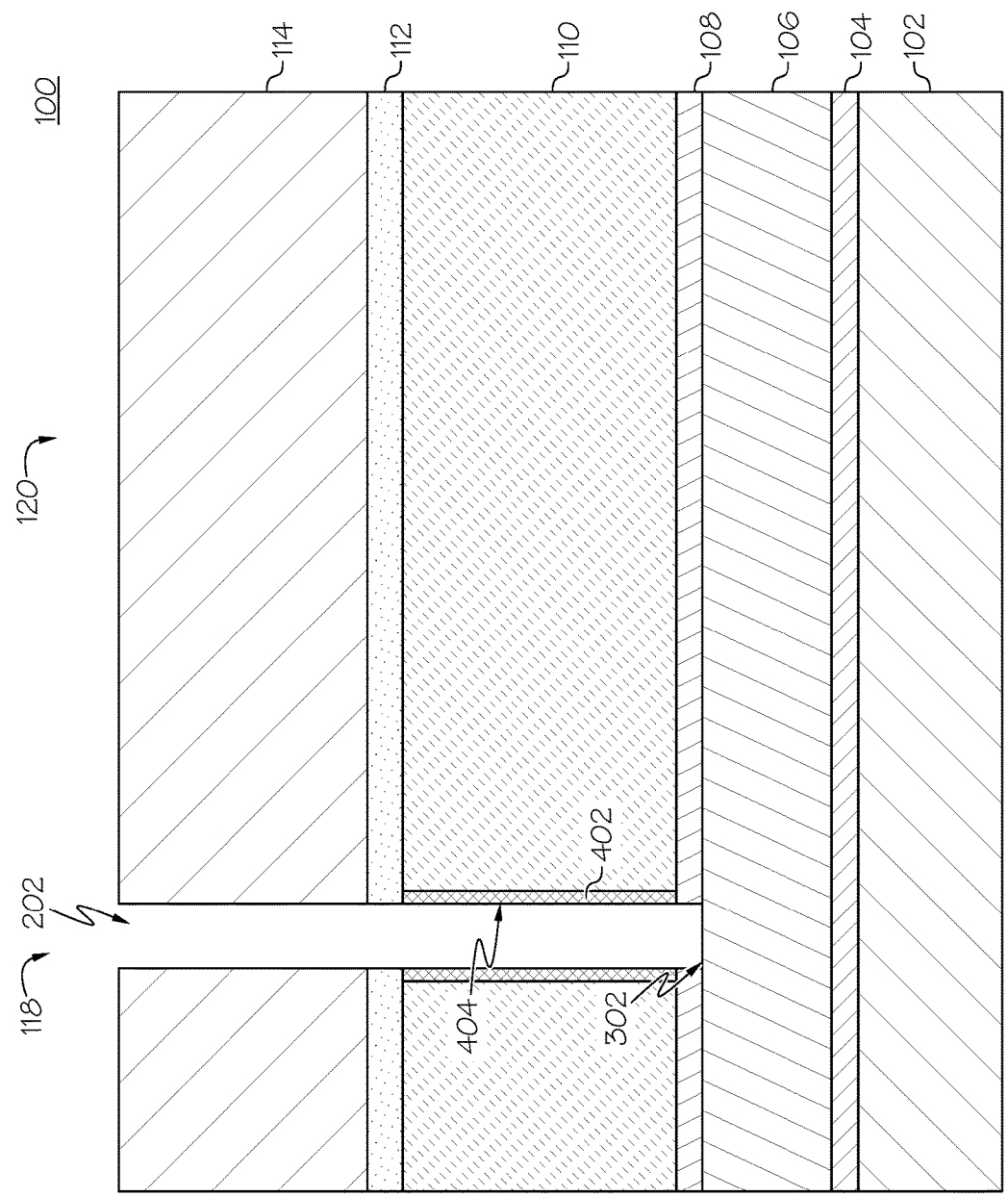
FIG. 4 is a cross-sectional view of the semiconductor structure after a protective layer has been formed on sidewalls of a replacement gate exposed within the first trench according to one embodiment of the present disclosure.
Figure 5:
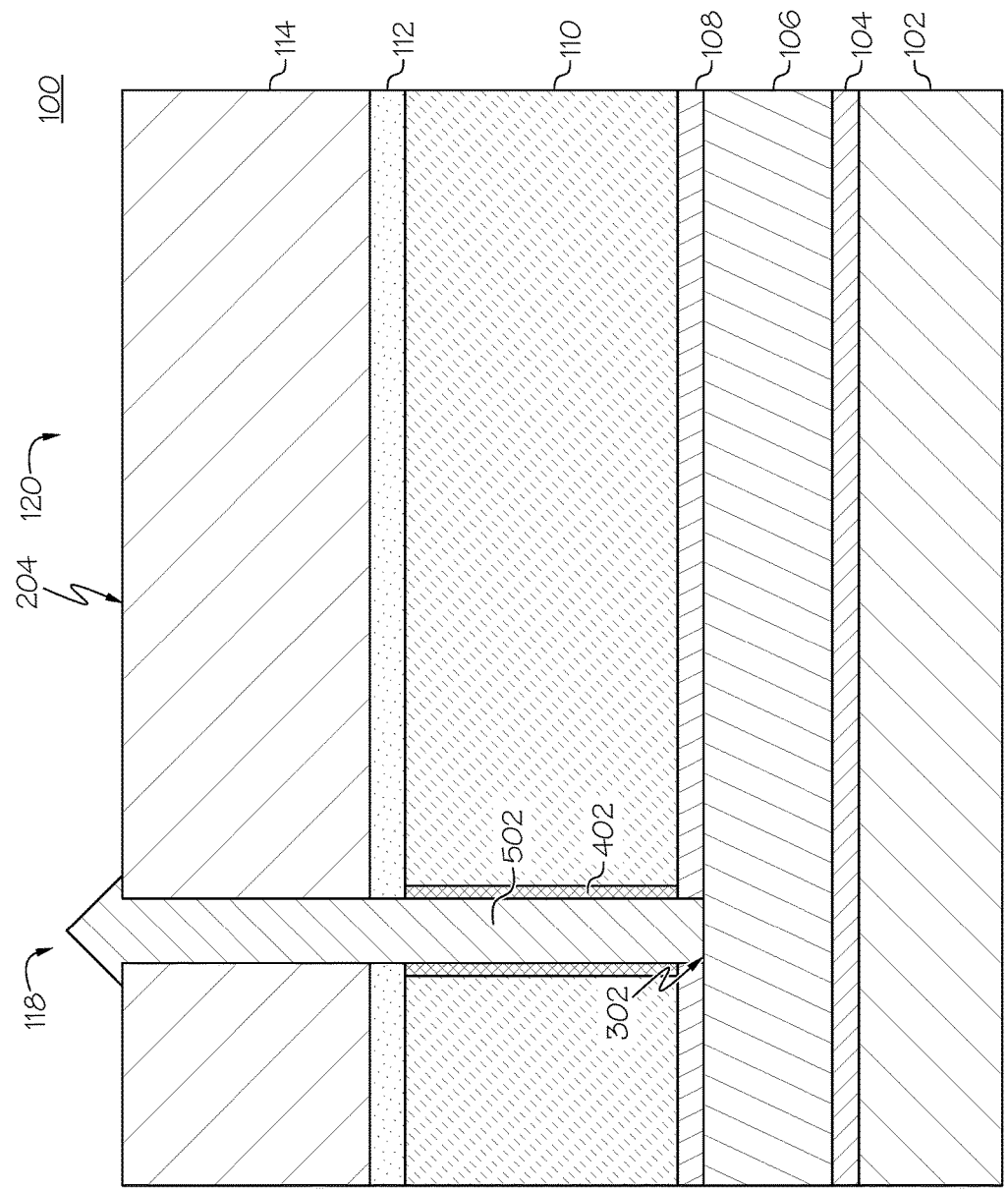
FIG. 5 is a cross-sectional view of the semiconductor structure after a first channel layer having a first doping concentration has been epitaxially grown within the first trench according to one embodiment of the present disclosure.

After the exposed portion 208 of the first spacer 108 has been etched away, a protective layer 402 is formed on exposed sidewalls 404 of the replacement gate 110 within the trench 202, as shown in FIG. 4. A plasma oxidation or other type oxidation process can be performed to form the protective layer 402. An epitaxy process is performed to grow a material 502 within the trench 202 forming a channel 532. For example, the epitaxy process grows the material 502 up from the portion 302 of the source contact layer 106 exposed in the trench 202 above the top surface 204 of the dielectric capping layer 114. The epitaxy process grows a first material utilizing a first doping concentration. For example, for an nFET device, the channel 502 can comprise, for example, $1e^{16}$-$1e^{17}$ cm$^{-2}$ phosphorous doped silicon, $1e^{17}$-$1e^{18}$ cm$^{-2}$ phosphorous doped silicon, and/or the like. For a pFET device, the channel 502 can comprise, for example, $1e^{17}$ cm$^{-2}$ boron doped SiGe$_{0.20}$, $1e^{17}$ cm$^{-2}$ boron doped SiGe$_{0.30}$, and/or the like. It should be noted that these materials (e.g., Ge, III-V materials, etc.) and doping concentrations are only illustrative and other materials and concentrations are applicable as well. The channel material and doping concentrations can be selected based on the desired threshold voltage of the device.

Figure 6:
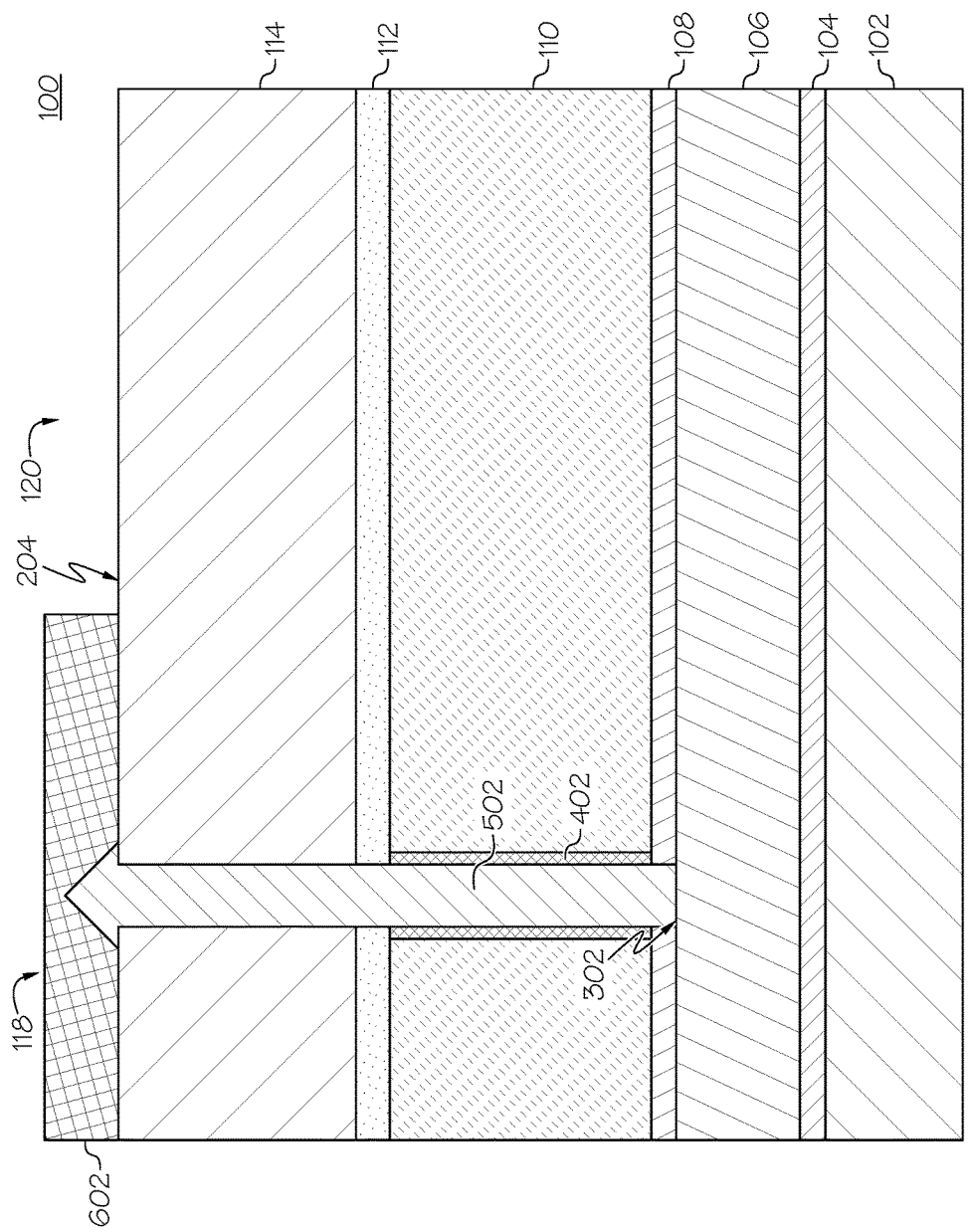
FIG. 6 is a cross-sectional view of the semiconductor structure after a hardmask has been formed on a top surface of the structure over a portion of the first channel layer according to one embodiment of the present disclosure.
Figure 7:
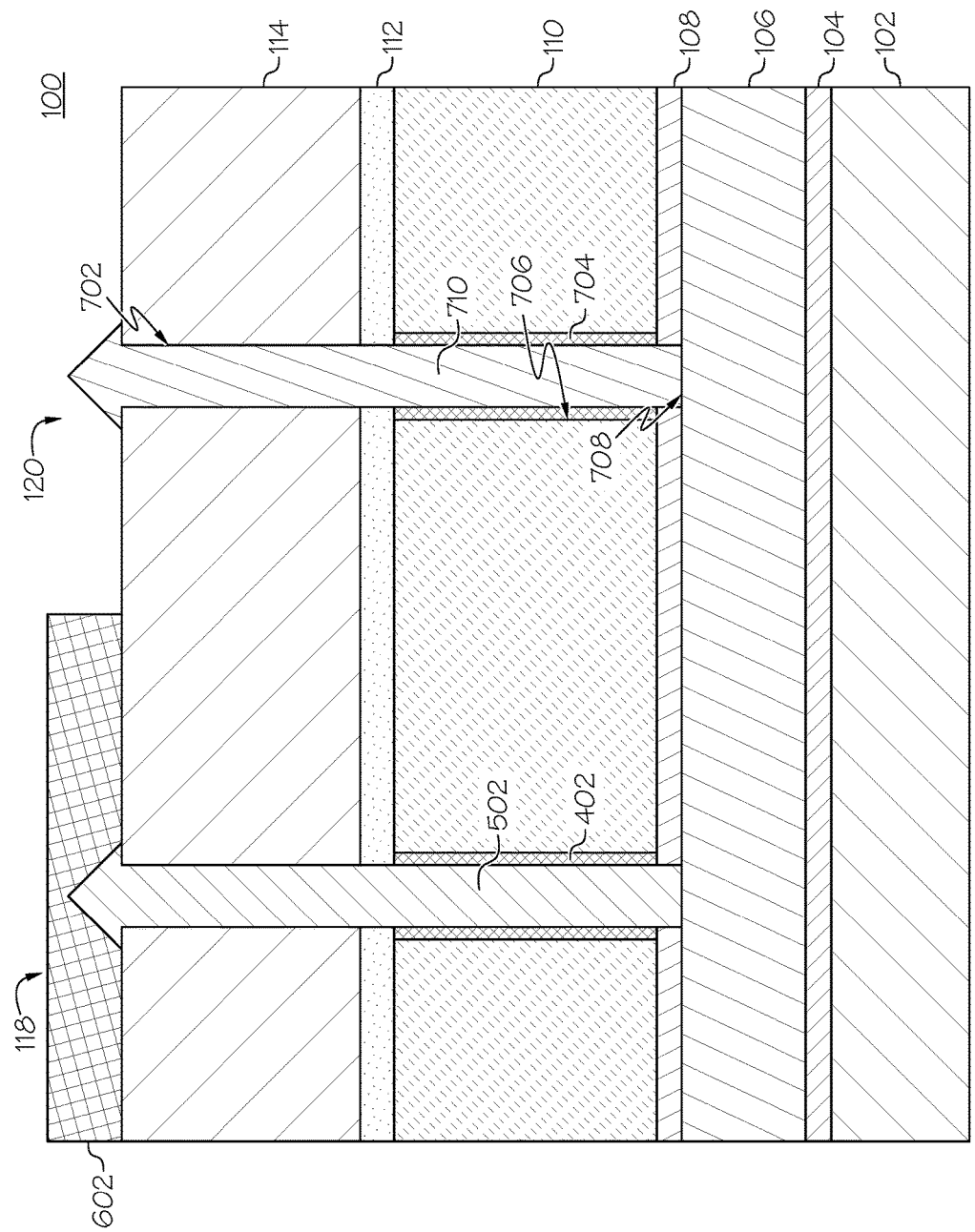
FIG. 7 is a cross-sectional view of the semiconductor structure after a second channel layer having a second doping concentration that is different from the first doping concentration has been epitaxially grown in a second trench within a second region of the of the semiconductor structure according to one embodiment of the present disclosure.

A hardmask material such as nitride is then deposited over and in contact with the dielectric capping layer 114 and exposed channel material. The hardmask material is then patterned to form a hardmask 602 over the VT1 region 118 to block this region from subsequent fabrication processes performed in the VTN region 120 of the structure 100, as shown in FIG. 6. Once the hard mask 602 has been formed a channel is formed in the VTN region utilizing similar fabrication processes to those discussed with respect to FIGS. 2-6. For example, FIG. 7 shows that a trench 702 has been etched through the top surface 204 of the oxide layer in the VTN region 120 of the structure 100 down to the source contact layer 106. A protective layer 704 has been formed on sidewalls 706 of a portion of the replacement gate within the VTN region 120. An epitaxy process has been performed to grow a material up from a portion 708 of the source contact layer 106 exposed in the trench 702 above the top surface 204 of the dielectric capping layer 114 forming a channel 710. In one embodiment, the first channel 502 within the VT1 region 118 comprises a different material(s) than the second channel 710 within the VTN region 120 of the structure 100. In other embodiments, the first and second channels 502, 710 comprise the same material(s). However, the doping concentrations used to form the channels 502, 710 are different. For example, if the first channel 502 was formed utilizing $1e^{16}$-$1e^{17}$ cm$^{-2}$ phosphorous doped silicon the second channel can be formed utilizing $1e^{17}$-$1e^{18}$ cm$^{-2}$ phosphorous doped silicon. In another example, if the first channel 502 was formed utilizing $1e^{17}$ cm$^{-2}$ boron doped SiGe$_{0.20}$ the second channel 710 can be formed utilizing $1e^{17}$ cm$^{2}$ boron doped SiGe$_{0.30}$. The different doping concentrations provide the devices being formed in the VT1 and VTN regions 118, 120 with different threshold voltages.

Figure 8:
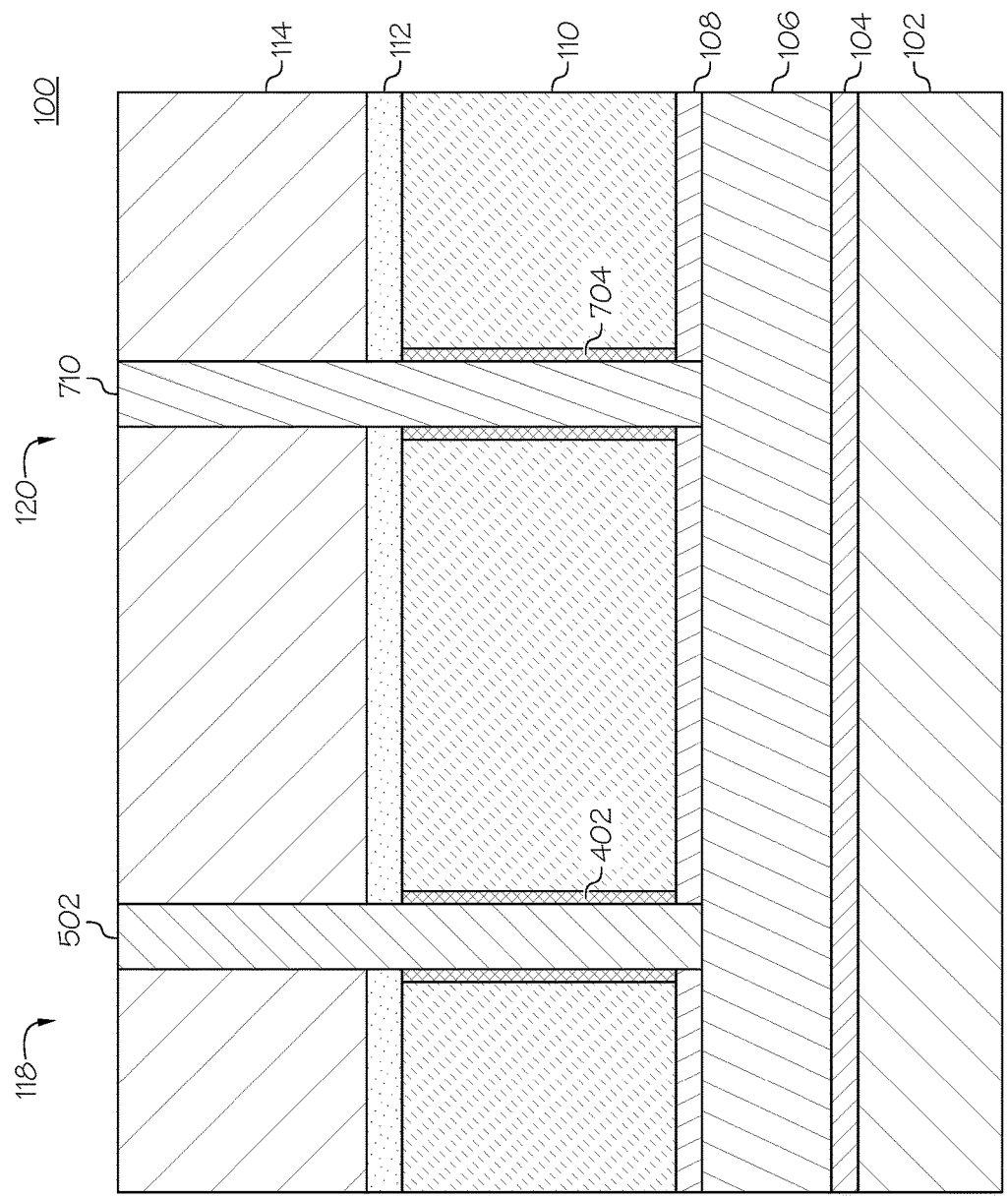
FIG. 8 is a cross-sectional view of the semiconductor structure after the hardmask and portions of the first and second channel layers extending above a top surface of the structure have been removed according to one embodiment of the present disclosure.
Figure 9:
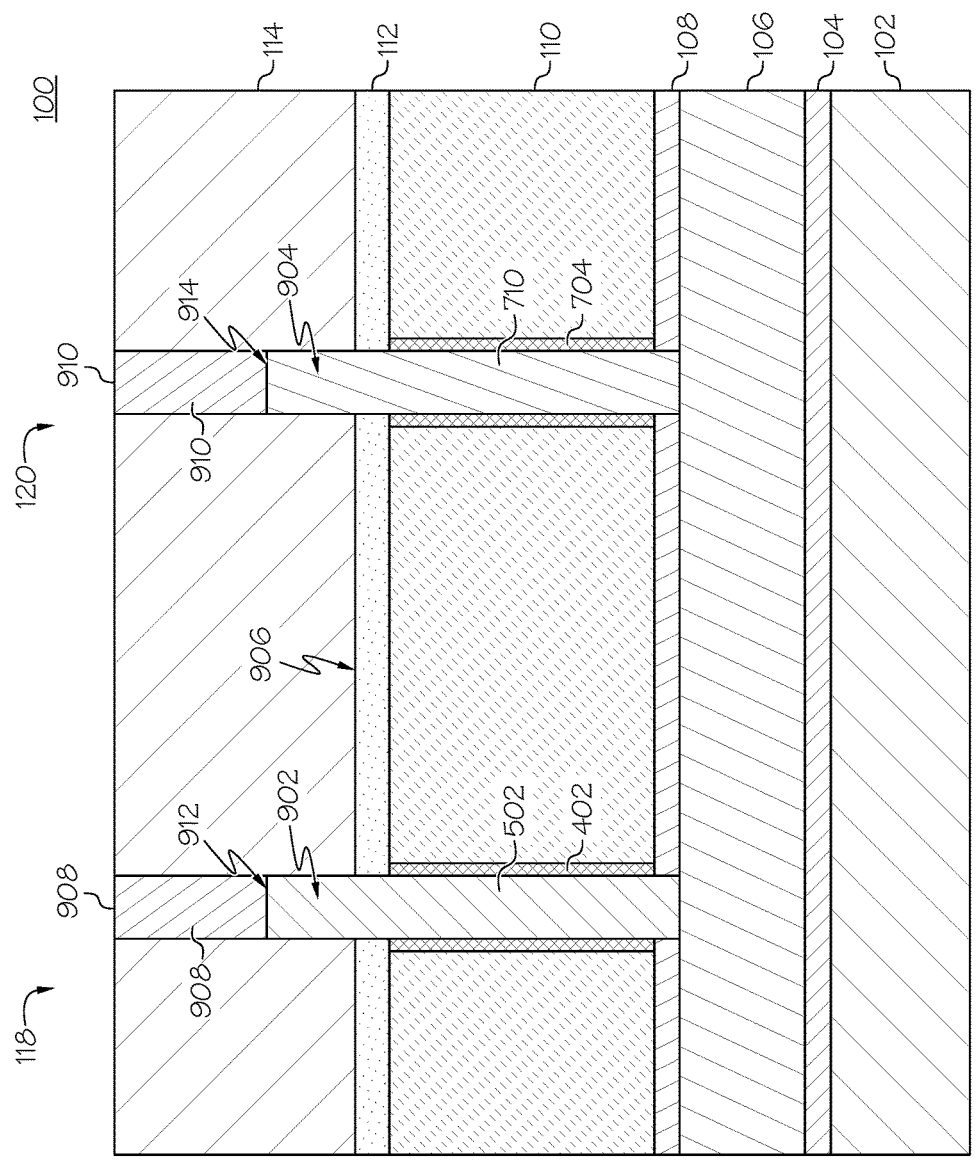
FIG. 9 is a cross-sectional view of the semiconductor structure after the first and second channel layers have been recessed and a mask formed thereon according to one embodiment of the present disclosure.

Once the second (or additional number) channel 710 has been formed, the hardmask 602 and any overgrowth of channel material are removed by, for example, a chemical-mechanical polishing (CMP) process that stops on the dielectric capping layer 114, as shown in FIG. 8. FIG. 9 shows a portion of the first and second channels 502, 710 being partially recessed via an etching process. In this embodiment, the channels 502, 710 are partially recessed so that a portion 902, 904 (e.g., 15-50 nm) of each channel 502, 710 remains above a top surface 906 of the second spacer 112. A masking material such as nitride is then deposited and polished back (stopping on the dielectric capping layer 114) to form a mask layer 908, 910 on and in contact with a top surface 912, 914 of the channels 502, 710.

Figure 10:
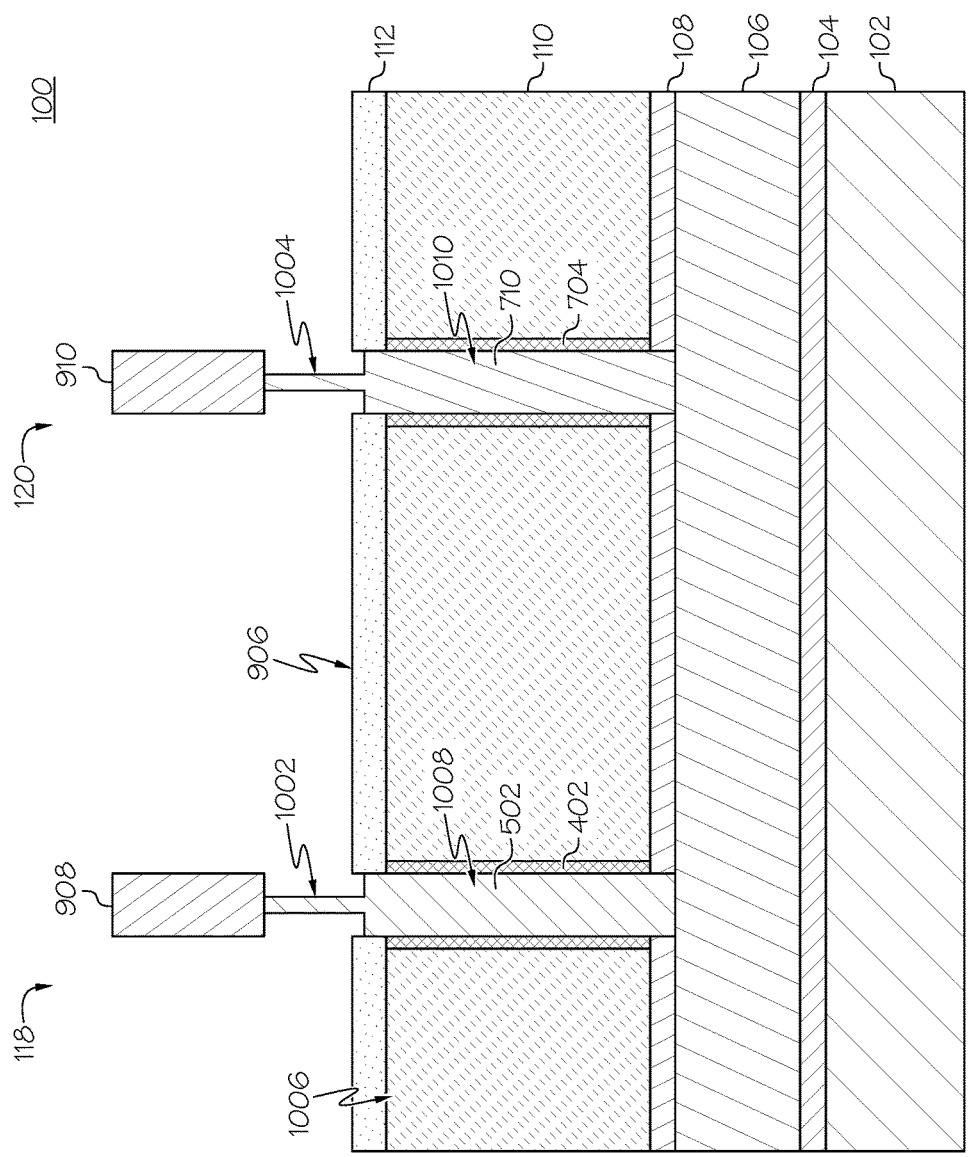
FIG. 10 is a cross-sectional view of the semiconductor structure after a portion of the first and second channel layers have been narrowed according to one embodiment of the present disclosure.

FIG. 10 shows that the dielectric capping layer 114 is removed by, for example, RIE or CMP, stopping on the second spacer layer 112. A lateral etch is then performed to narrow a portion 1002, 1004 of the channels 502, 710 where drain terminals of the devices are to be formed. The narrowed portions 1002, 1004 comprise the portions 902, 904 of the channels 502, 710 remaining above the second spacer 112 and a portion of the channels 502, 710 extending below the top surface 906 of the second spacer 112 and above a bottom surface 1006 of the second spacer 112. In one embodiment, the narrowed portions 1002, 1004 of the channels 502, 710 comprise a width of, for example 2 nm to 5 nm while the remaining portions 1008, 1010 of the channels 502, 710 comprise a width of width of 4 nm to 10 nm. The lateral etch can be, for example, a wet etch process.

A drain 1102, 1104 is then formed on the narrowed portions 1002, 1004 of the channels 502, 710 in each of the VT1 and VTN regions 118, 120. The drains 1102, 1104 extend from laterally from a sidewalls 1106, 1108 of the narrowed portions 1002, 1004 beyond the sidewalls 1110, 1112 of the un-narrowed portions 1008, 1010 of the channels 502, 710 and down to a top surface 1114, 1116 of the un-narrowed portions 1008, 1010. Therefore, a bottom portion 1118, 1120 of the drains 1102, 1104 is below the top surface 906 of the second spacer 112 and above the bottom surface 10006 of the second spacer 112.

Figure 11:
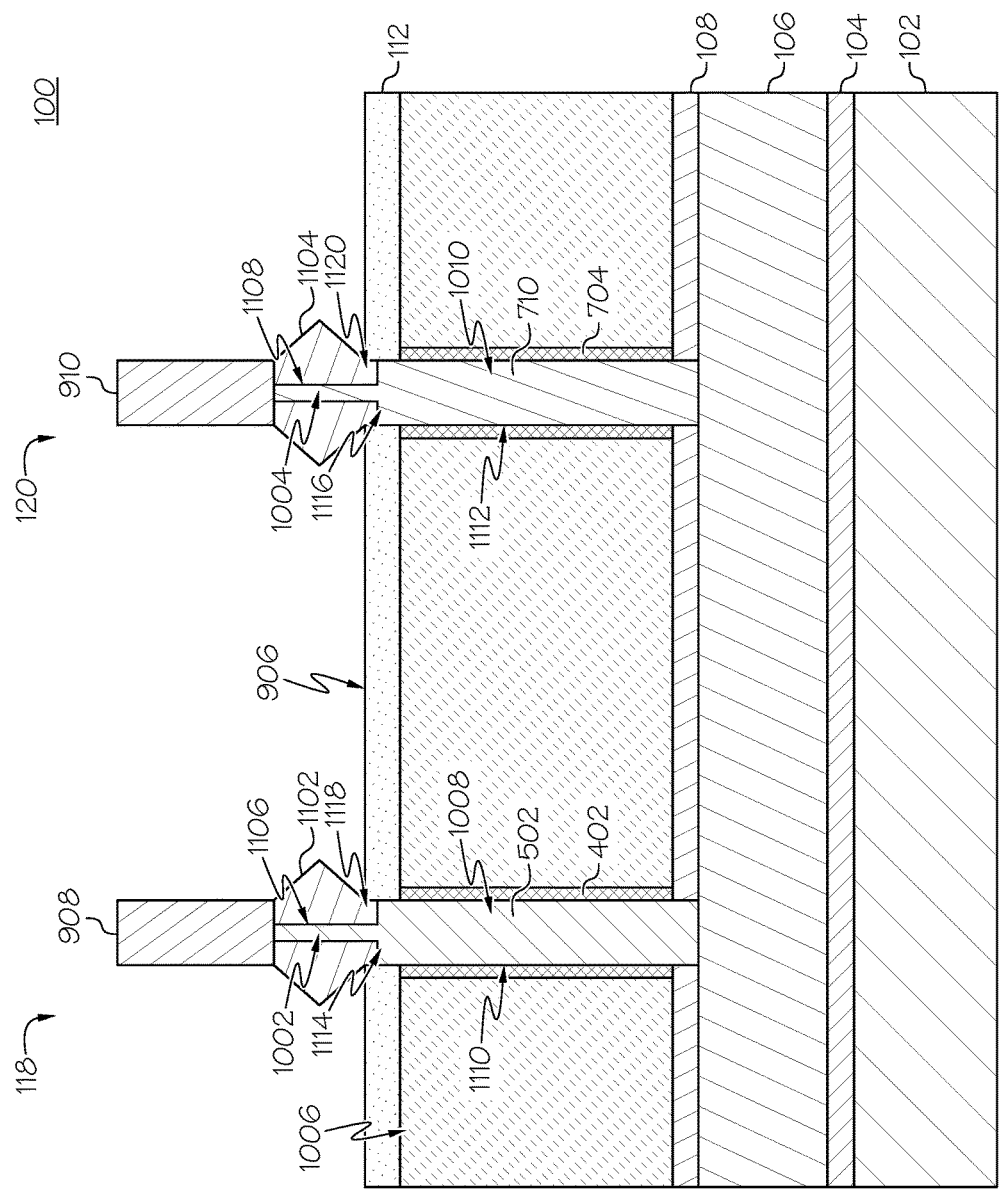
FIG. 11 is a cross-sectional view of the semiconductor structure after drain regions have been formed on the narrowed portions of the first and second channel layers according to one embodiment of the present disclosure.

The drains 1102, 1104 can be formed using an epitaxy process. For example, epitaxy that is selective with respect to the materials of the mask layers 908, 910 and the second spacer 112 is used grow material from the narrowed portions 1002, 1004 of the channels 502, 710 to form the drains 1102, 1104. The drains 1102, 1104 comprise in-situ doping (boron, in one embodiment for pFET and phosphorus, in one embodiment, for nFET). It should be noted that, according to one embodiment, the drains 1102, 1104 may not contain any doping. In the present embodiment, the doping can be performed using any standard approach such as ion implantation. In particular, the growth rates for (100) vs. (110) oriented planes are engineered so that during the epitaxial growth on (100) Si faceted drains are obtained. As shown in FIG. 11, the drains 1102, 1104 comprise angled sides rather than completely abutting the gate. It should be noted that, non-faceted (i.e. vertical) epitaxy and/or multiple epitaxy steps can be used to form the drain structure without limiting the scope of the present disclosure.

Figure 12:
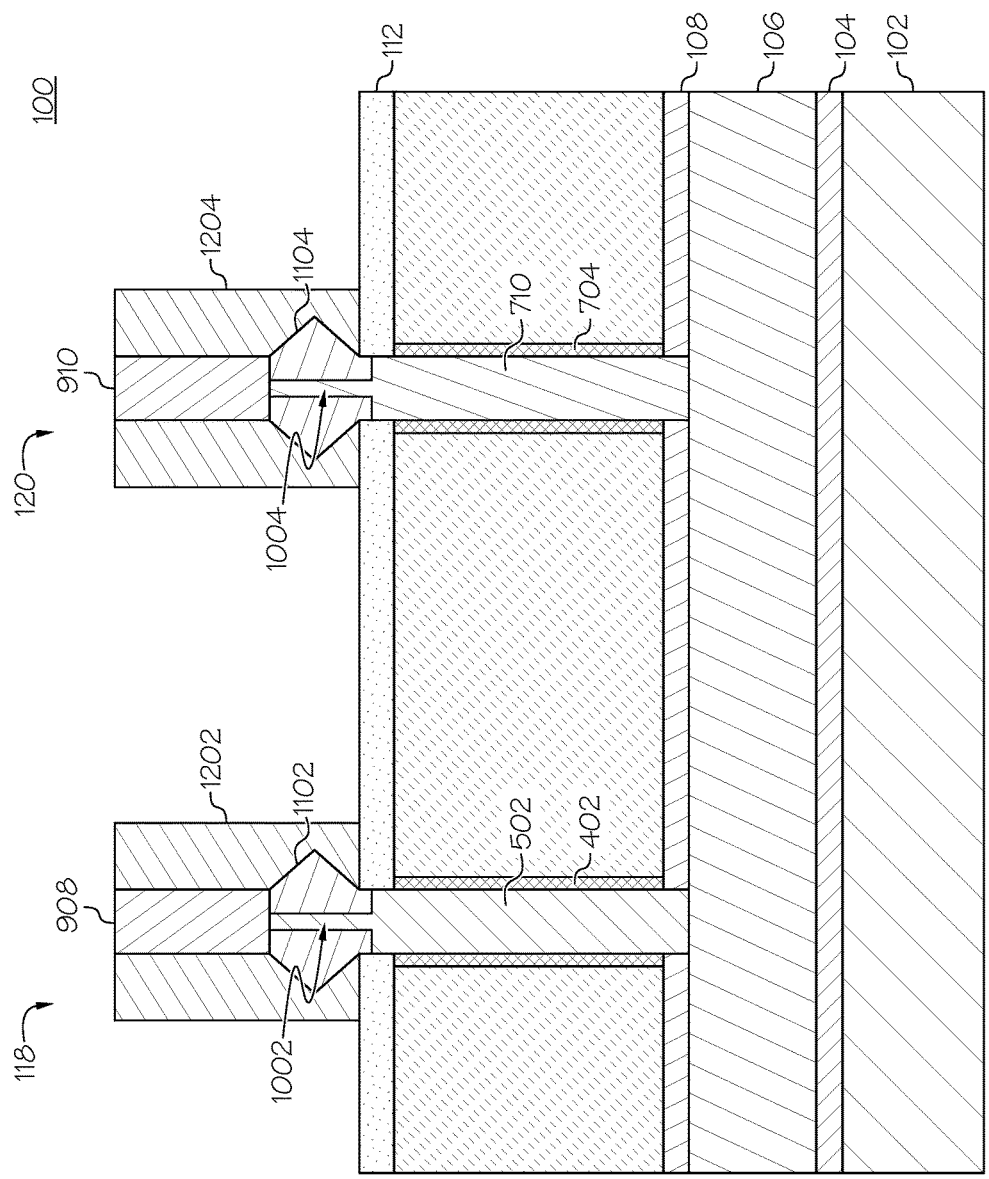
FIG. 12 is a cross-sectional view of the semiconductor structure after spacers have been formed on the drain regions, masks, and top spacer layer of the structure according to one embodiment of the present disclosure.

FIG. 12 shows that sacrificial spacers 1202, 1204 comprising a dielectric material (such as silicon oxide, silicon nitride, silicon oxynitride, or a combination of these) is formed on and in contact with the sidewalls of the mask layers 908, 910, the sidewalls of the drains 1102, 1104, and the top surface 906 of the second spacer layer 112. The sacrificial spacers 1202, 1204 can extend 2 nm to 10 nm past the edge of the drain epitaxy on each side. The spacers 1202, 1204 extend laterally beyond the drains 1102, 1104 and are planar with a top surface of the mask layers 908, 910. In the illustrated embodiment, the dielectric material is formed and then reactive-ion etching is used to remove the dielectric material except from the sidewalls of the mask layers 908, 910, the sidewalls of the drains 1102, 1104, and the top surface 906 of the second spacer layer 112.

Figure 13:
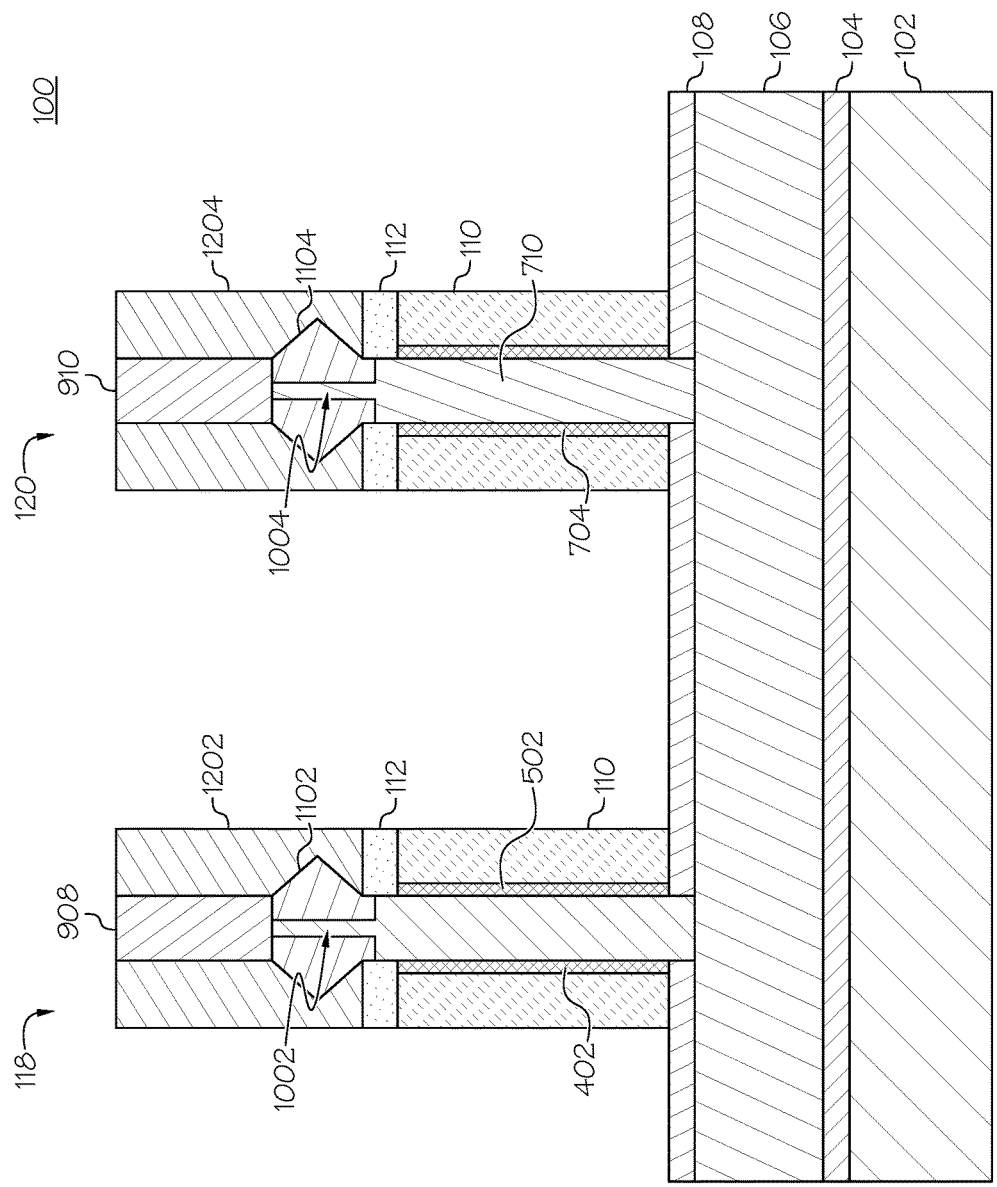
FIG. 13 is a cross-sectional view of the semiconductor structure after portions of the structure not underlying the spacers have been removed down to a bottom spacer layer according to one embodiment of the present disclosure.
Figure 14:
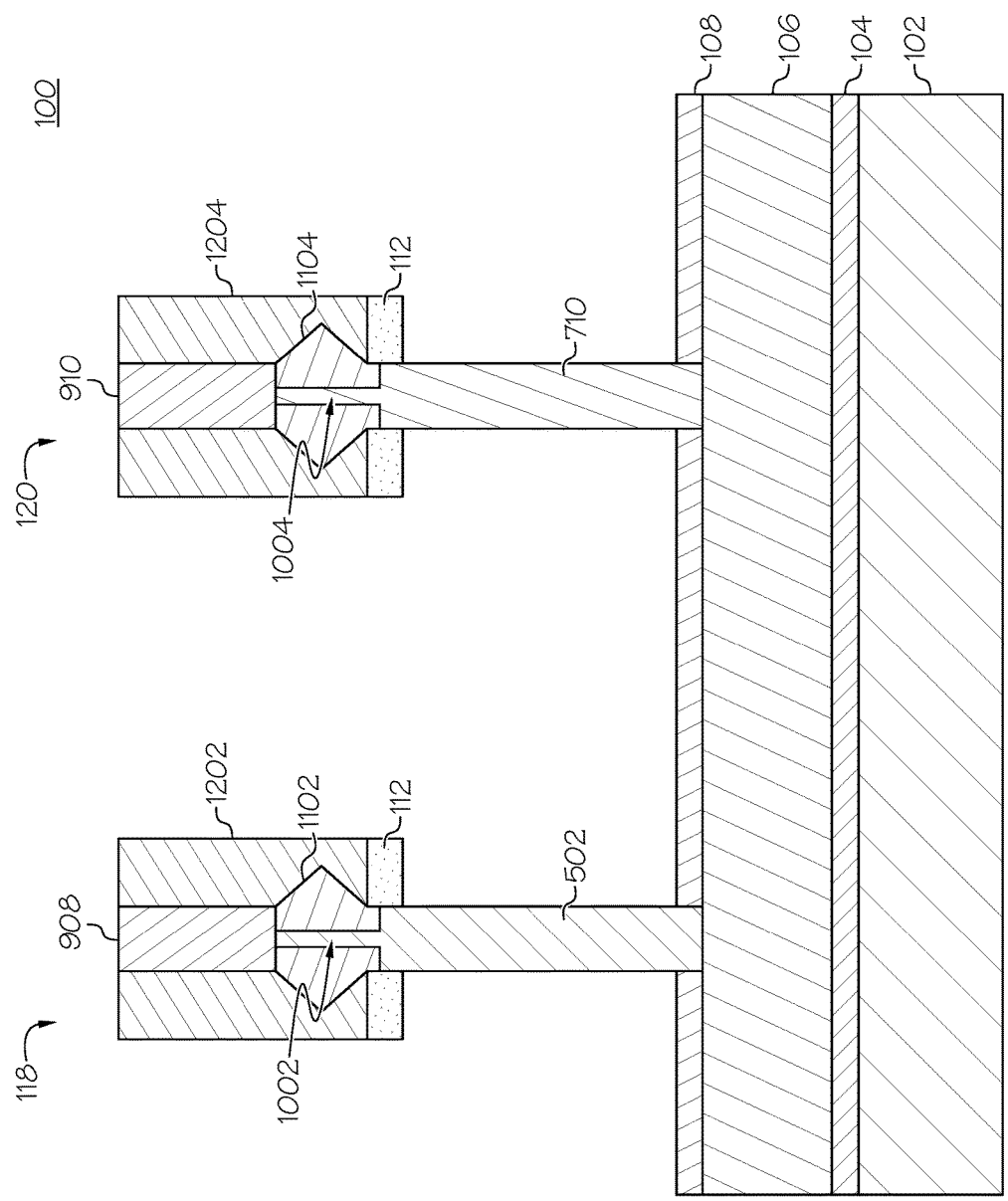
FIG. 14 is a cross-sectional view of the semiconductor structure after a replacement gate has been removed exposing portions of the first and second channel layers according to one embodiment of the present disclosure.

Portions of the second spacer layer 112 and portions of the replacement gate 110 not underlying the sacrificial spacers 1202, 1204 are then removed, as shown in FIG. 13. For example, a first etching process such as RIE is performed to etch portions of the replacement gate 110 not underlying the sacrificial spacers 1202, 1204 selective to the replacement gate 110. Then, a second etching process such as RIE is then performed to etch portions of the replacement gate 110 not underlying the sacrificial spacers 1202, 1204 selective to the first spacer layer 108. Portions of the replacement gate 110 underlying the sacrificial spacers 1202, 1204 and the protective layers 402, 704 are then removed exposing the channels 502, 710, as shown in FIG. 14. The portions of the replacement gate 110 underlying the sacrificial spacers 1202, 1204 and the protective layers 402, 704 can be removed by selective etching or another technique.

Figure 15:
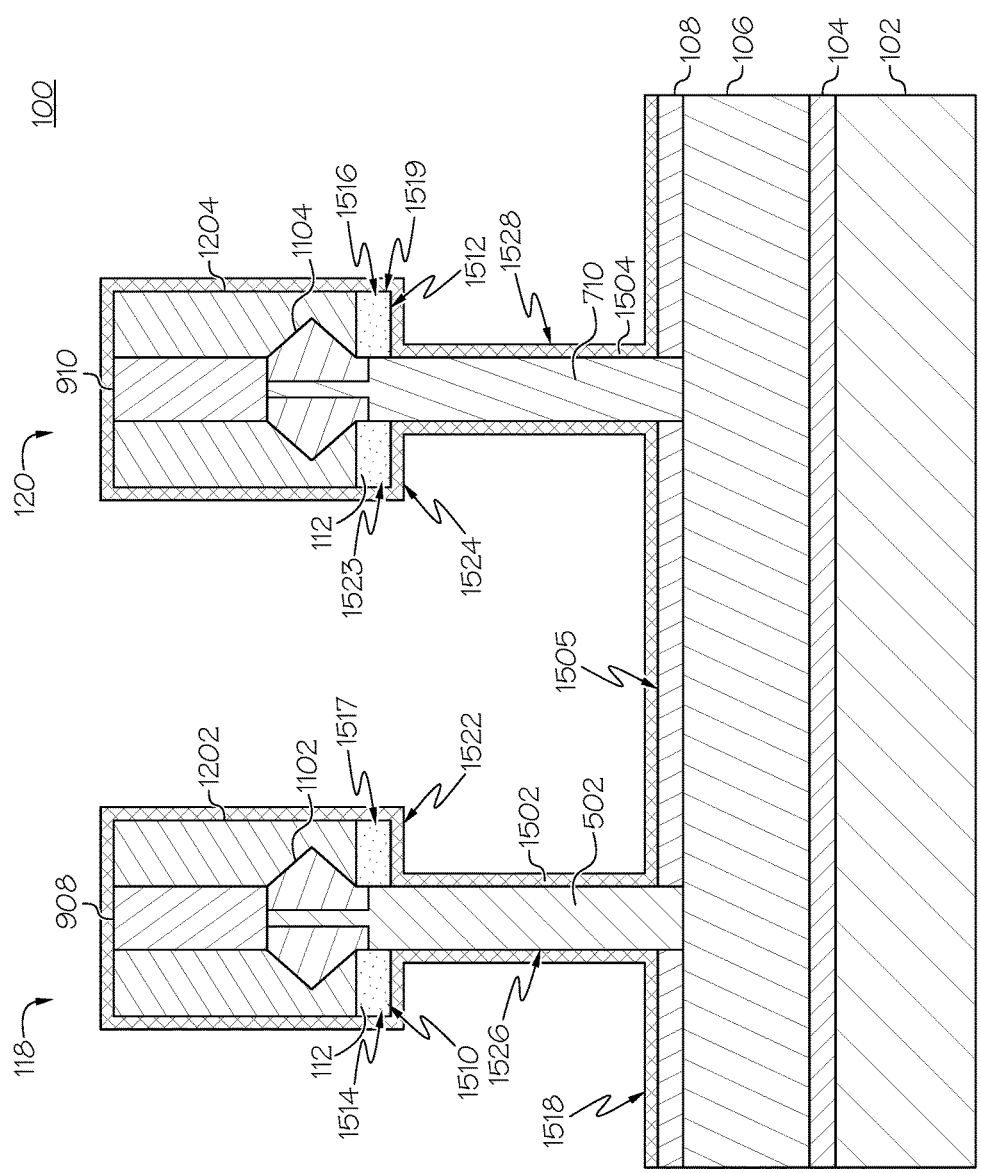
FIG. 15 is a cross-sectional view of the semiconductor structure after a dielectric layer has been formed on the exposed portions of the first and second channel layers according to one embodiment of the present disclosure.

Once the replacement gate 110 and protective layers 402, 704 have been removed, an RMG process is performed. For example, a high-k dielectric material is blanket deposited over the entire structure 100, for example by CVD (chemical vapor deposition), PECVD (plasma enhanced chemical vapor deposition), or ALD (Atomic layer deposition), as shown in FIG. 15. The high-k gate material forms a high-k gate dielectric layer 1502, 1504 on, in contact with, and conforming to sidewalls of the spacer layers 1202, 1204, a top surface of the mask layers 902, 904, a top surface 1505 of the first spacer layer 108, sidewalls of the channels 502,710, a bottom surface 1510, 1512 of portions 1514, 1516 of the second spacer layer 112 underlying the sacrificial spacers 1202, 1204, and sidewalls 1517, 1519 of the portions 1514, 1516 of the second spacer layer 112. In one embodiment, the high-k dielectric layer 1502, 1504 is a continuous layer formed over both structures within the first and second regions 118, 120. The high-K gate dielectric layer 1502, 1504 can have a thickness between 0.1 nm and 3 nm.

In one embodiment, the portions 1518, 1520 of the high-k gate dielectric layer 1502, 1504 conforming to the first spacer layer 108 are substantially parallel to the portions 1522, 1524 of the high-k gate dielectric layer 1502, 1504 conforming to the 1510, 1512 of portions 1514, 1516 of the second spacer layer 112. The portions 1526, 1528 of the high-k gate dielectric layers 1502, 1504 conforming to the sidewalls of the channels 502, 710 are substantially perpendicular to portions 1518, 1520, 1522, 1524 of the high-k gate dielectric layer, 1502, 1504. The portions 1526, 1528 of the high-k gate dielectric layers 1502, 1504 conforming to the sidewalls of the channels 502, 710 are also parallel to portions 1521, 1523 of the high-k gate dielectric layers 1502, 1504 conforming to the sidewalls 1517, 1519 of the second spacer layer 112. This configuration of the high-k gate dielectric layer 1502, 1504, in one embodiment, forms a C or rotated U shape.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

Figure 16:
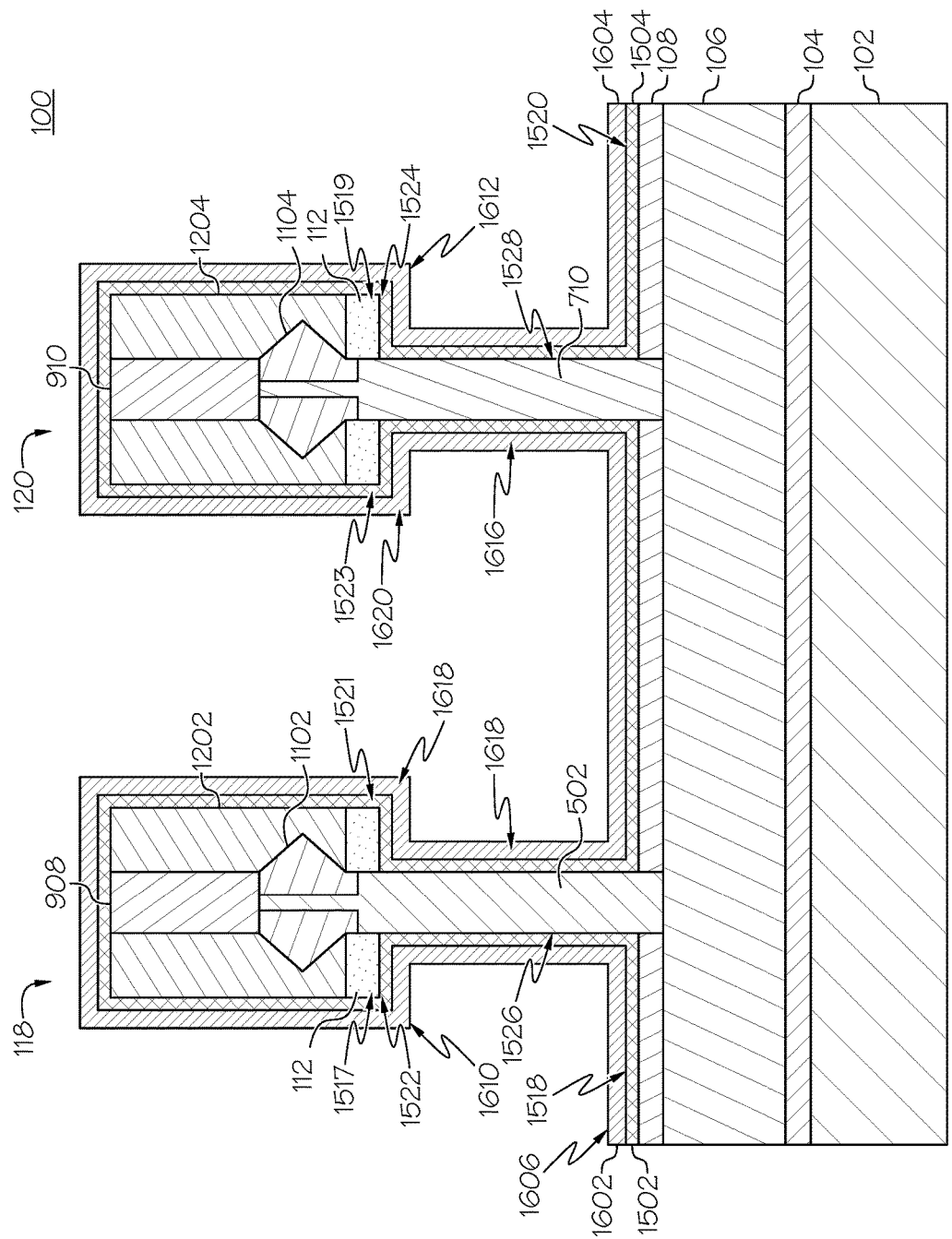
FIG. 16 is a cross-sectional view of the semiconductor structure after metal gate layers have been formed conforming to dielectric layers according to one embodiment of the present disclosure.

FIG. 16 shows that one or more conductive materials are deposited over the entire structure 100 to form metal gates 1602, 1604 conforming to and in contact with the high-k gate dielectric layers 1502, 1504. The metal gates 1602, 1604 comprise a configuration similar to that of the high-k gate dielectric layers 1502, 1504 discussed above with respect to FIG. 15. For example, portions 1606, 1608 of the metal gates 1602, 1604 conforming to portions 1518, 1520 of the high-k gate dielectric layer 1502, 1504 are substantially parallel to the portions 1610,1612 of the of the metal gates 1602, 1604 conforming to portions 1522, 1524 of the high-k gate dielectric layer 1502, 1504. Portions 1614, 1616 of the metal gates 1602, 1604 conforming to portions 1526, 1528 of the high-k gate dielectric layers 1502, 1504 are substantially perpendicular to portions 1606, 1608, 1610, 1612 of the metal gates 1602, 1604. Also, portions 1614, 1616 are parallel to portions 1618, 1620 of the metal gates 1602, 1604 conforming to portions 1521, 1523 of the high-k gate dielectric layers 1502, 1504.

In one embodiment, the conductive material comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The conductive material may comprises multiple layers such as gate workfunction setting layer (work function metal) and gate conductive layer.

Figure 17:
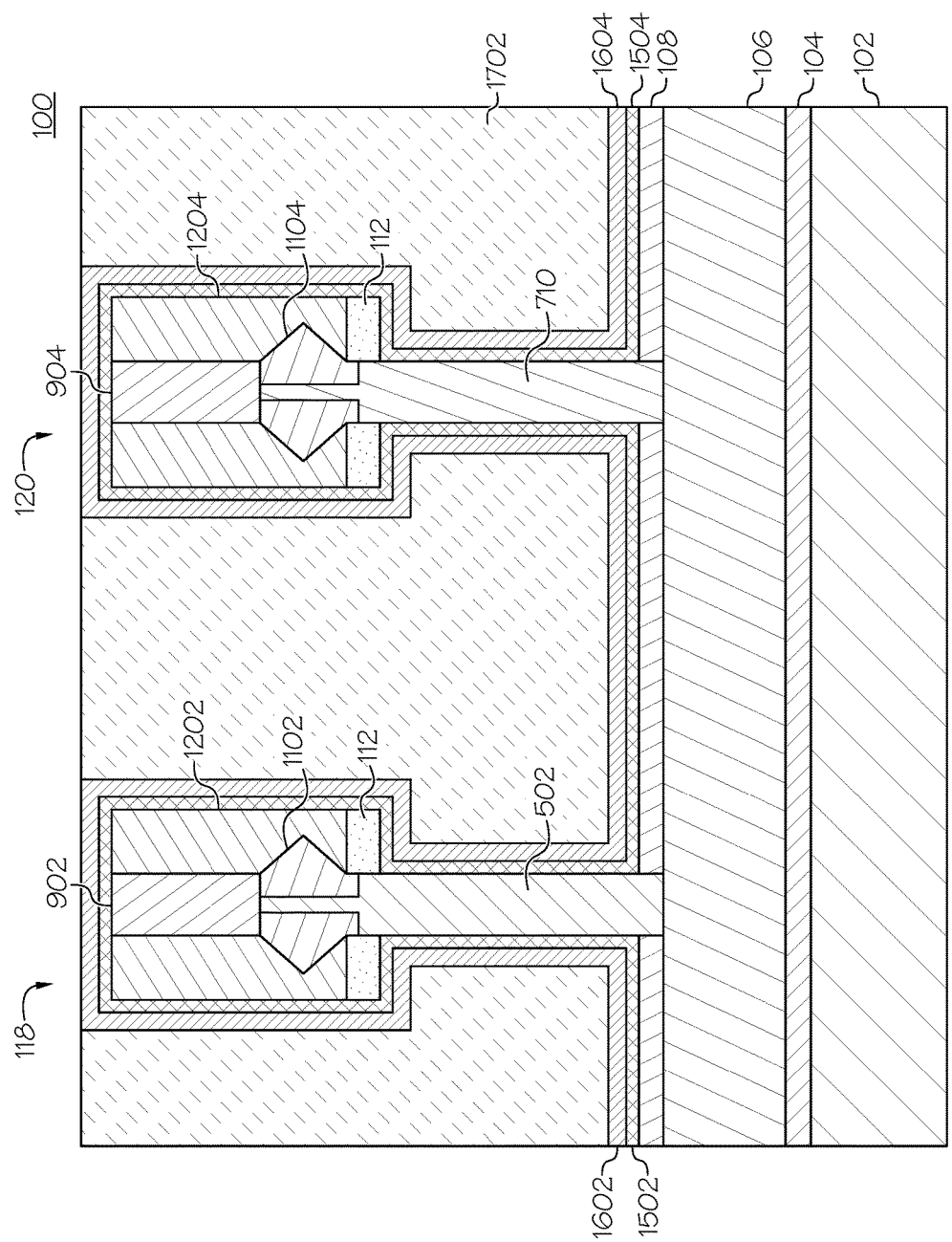
FIG. 17 is a cross-sectional view of the semiconductor structure after a metal gate fill has been deposited over the structure according to one embodiment of the present disclosure.
Figure 18:
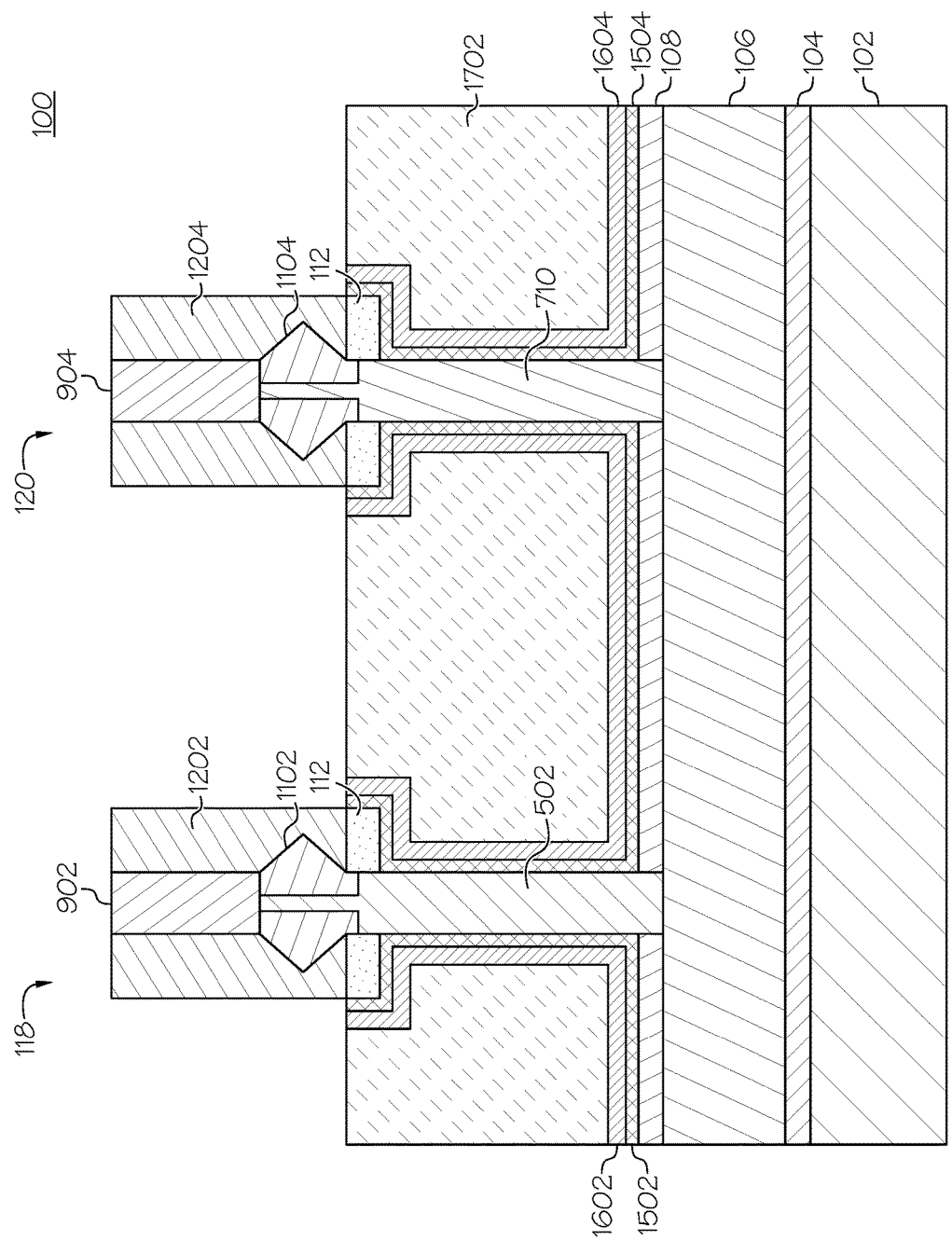
FIG. 18 is a cross-sectional view of the semiconductor structure after the metal gate fill has been recessed according to one embodiment of the present disclosure.

FIG. 17 shows that a gate fill material layer 1702 is blanket deposited over the structure 100 shown in FIG. 16. The gate fill material layer 1702 can be, for example, tungsten or aluminum. The gate fill material layer 1702 is then polished using, for example, CMP. For example, FIG. 18 shows that the gate fill material layer 1702 has been polished down to a top surface 906 of the second spacer layer 112. FIG. 18 also shows that a subsequent polishing or etching process is performed to remove portions of the metal gates 1602, 1604 and corresponding high-k dielectric layer 1502, 1504 that are above the top surface 706 of the second spacer layer 406.

Figure 19:
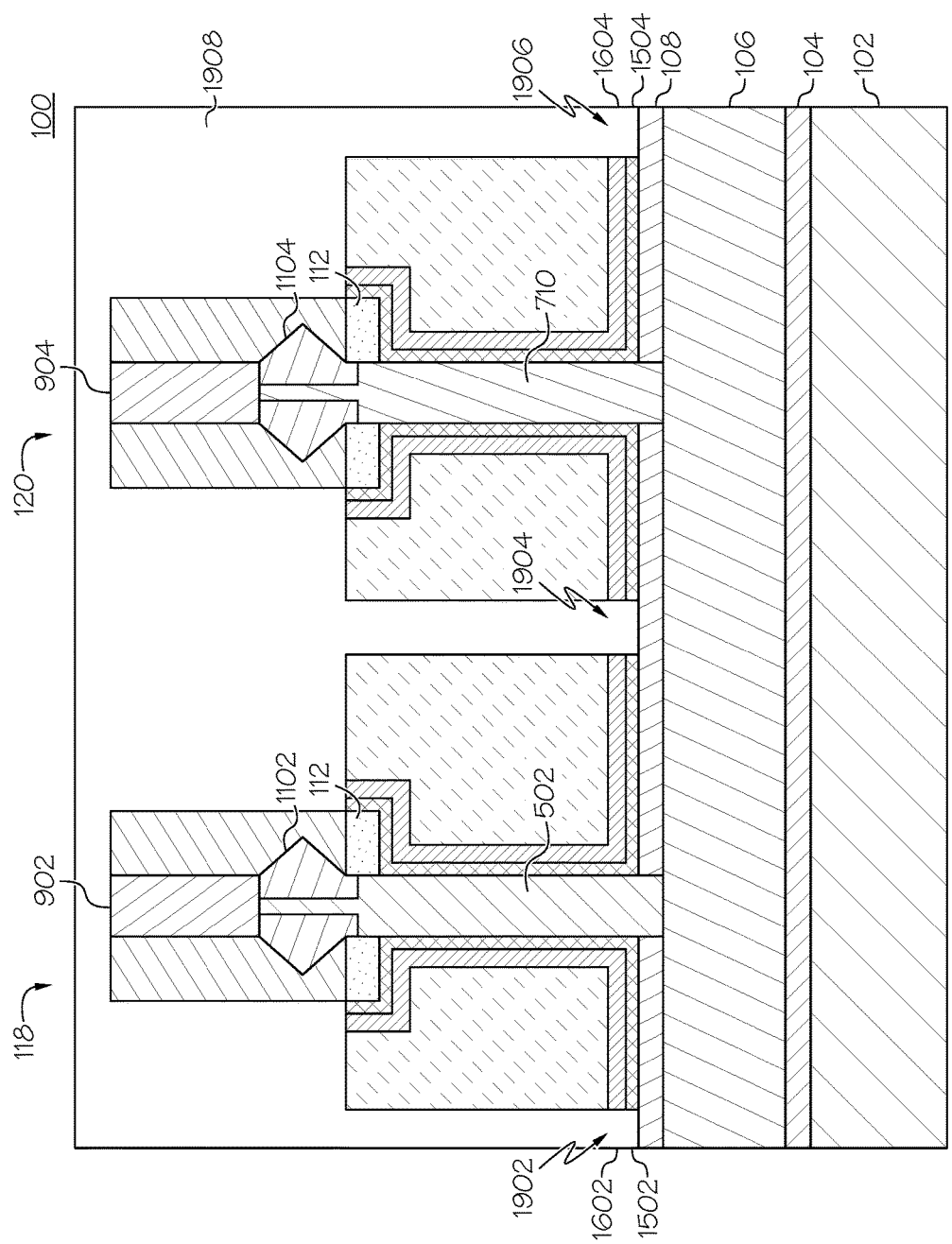
FIG. 19 is a cross-sectional view of the semiconductor structure after the recessed metal gate fill has been patterned according to one embodiment of the present disclosure.
Figure 20:
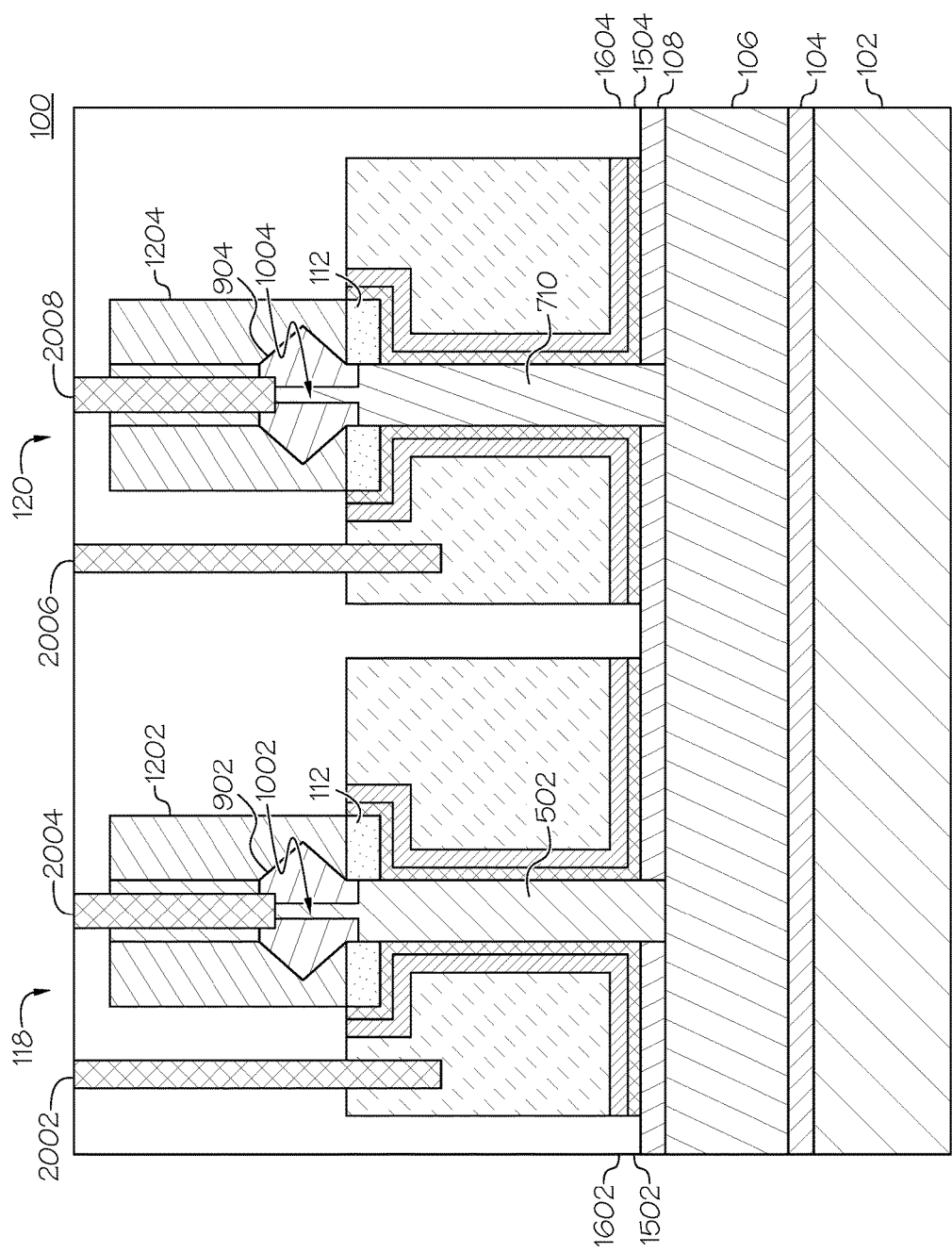
FIG. 20 is a cross-sectional view of the semiconductor structure after a dielectric material has been deposited over the structure and contacts have been formed according to one embodiment of the present disclosure.

Lithography and etching processes are used to pattern the recessed gate fill material layer 1702. For example, FIG. 19 shows that areas of the recessed portions of the recessed gate fill material layer 1702, portions of the high-k gate dielectric layers 1502, 1504, and metal gates 1602, 1604 have been removed exposing portions 1902, 1904, 1906 of the bottom spacer layer 108 on each side of the devices in the first and second regions 118, 120. FIG. 19 also shows that an interlayer dielectric material 1908 has been formed over the entire structure 100. The fabrication process is then continued to form contacts for the devices in the first and second regions 118, 120. For example, FIG. 20 shows that lithography and etching processes are performed to create contact trenches within the dielectric material 1702 and down into (below a top surface) the recessed gate fill material layer 1702 on at least one side of the devices within the first and second regions 118, 120. This lithography and etching processes also form a trench within the hardmasks 908, 910 between the spacers 1202, 1204 to create contact trenches exposing at least a top surface of the drains 1102, 1104 and the narrowed portions 1002, 1004 of the channels 502, 710. A metallization process is then performed to create contacts 2002, 2004, 2006, 2008 in the contact trenches. The metallization can involve CVD, PVD, ALD, or electroplating processes or some combination of these processes.

Figure 21:
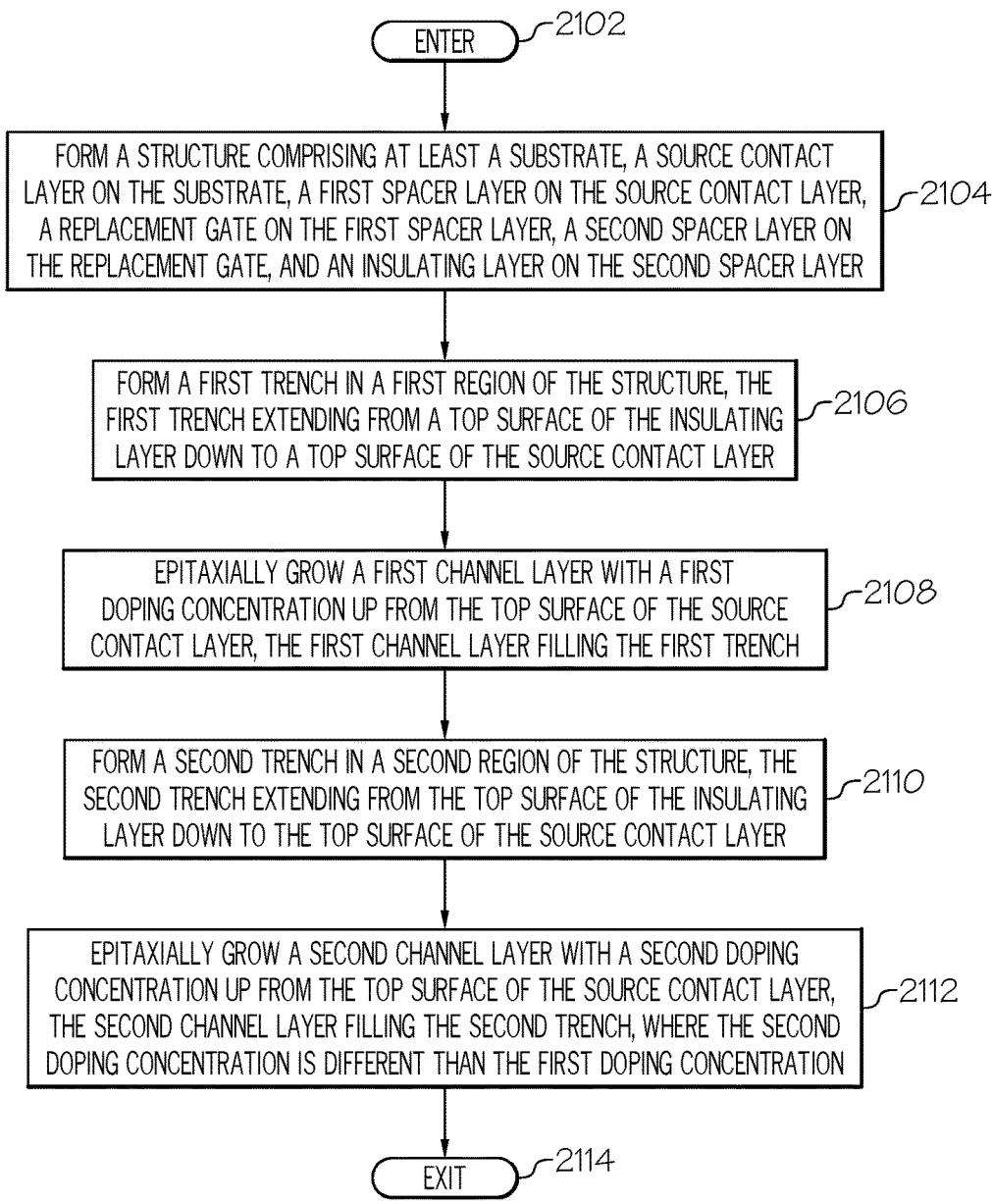
FIG. 21 is an operational flow diagram illustrating one process for forming a semiconductor structure comprising vertical field-effect-transistors having different voltage thresholds according to one embodiment of the present disclosure.

FIG. 21 is an operational flow diagram illustrating one process for forming a semiconductor structure comprising a plurality of vertical FETs having different voltage thresholds according to one embodiment of the present disclosure. In FIG. 21, the operational flow diagram begins at step 2102 and flows directly to step 2104. It should be noted that each of the steps shown in FIG. 21 has been discussed in greater detail above with respect to FIGS. 1-20. A structure comprising at least a substrate, a source contact layer on the substrate, a first spacer layer on the source contact layer, a replacement gate on the first spacer layer, a second spacer layer on the replacement gate, and an insulating layer on the second spacer layer is formed, at step 2104. A first trench, at step 2106, is formed in a first region of the structure, the first trench extending from a top surface of the insulating layer down to a top surface of the source contact layer.

A first channel layer with a first doping concentration, at step 2108, is epitaxially grown up from the top surface of the source contact layer, the first channel layer filling the first trench. A second trench, at step 2110, is formed in a second region of the structure. The second trench extends from the top surface of the insulating layer down to the top surface of the source contact layer. A second channel layer with a second doping concentration, at step 2112, is epitaxially grown up from the top surface of the source contact layer, where the second channel layer fills the second trench. The second doping concentration is different from the first doping concentration. Additional fabrication processes such as metal gate and contact formation can then be performed. The control flow exits at step 2114.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:
1. A semiconductor structure comprising:
   a first vertical field-effect transistor comprising a first threshold voltage; and
   at least a second vertical field-effect transistor comprising a second threshold voltage that is different from the first threshold voltage,
   wherein each of the first vertical field-effect transistor and the second vertical field-effect transistor comprises
      a source layer and a drain layer, wherein each drain layer is formed in a region of the first vertical field-effect transistor and second vertical field-effect transistor, respectively, above the source layer,
      substrate in contact with the source layer,
      a first spacer layer on the source layer,
      a second spacer layer, where a portion of the drain layer extends over the second spacer, and
      metal gate in contact with sidewalls of the epitaxially grown channel layer, a top surface of the first spacer layer, and a bottom surface of the second spacer layer.

2. The semiconductor structure of claim 1, wherein the first vertical field-effect transistor comprises an epitaxially grown channel layer with a first doping concentration, and wherein the second vertical field-effect transistor comprises an epitaxially grown channel layer with a second doping concentration that is different from the first doping concentration.

3. The semiconductor structure of claim 1, wherein the epitaxially grown channel layer of each of the first and second vertical field-effect transistors comprises a narrowed portion above a bottom surface of the second spacer layer that extends above a top surface of the second spacer layer.

4. The semiconductor structure of claim 3, wherein for each of the first and second vertical field-effect transistors the drain layer is formed on and in contact with sidewalls of the narrowed portion of the epitaxially grown channel layer and a top surface of a portion of the epitaxially grown channel layer that is below the narrowed portion of the epitaxially grown channel layer.

5. The semiconductor structure of claim 1, wherein for each of the first and second vertical field-effect transistors a portion of the drain layer extends below a top surface of the second spacer layer.

6. The semiconductor structure of claim 1, wherein each of the first and second vertical field-effect transistors further comprises a dielectric material in contact with at least the drain layer.

7. The semiconductor structure of claim 1, wherein each of the first and second vertical field-effect transistors further comprises a counter-doped layer in contact with the substrate.

8. The semiconductor structure of claim 1, wherein each of the first and second vertical field-effect transistors further comprises a dielectric layer in contact with at least the first spacer, the epitaxially grown channel layer, and the second spacer.

9. The semiconductor structure of claim 8, wherein each of the first and second vertical field-effect transistors further comprises a metal gate in contact with the dielectric layer.

10. An integrated circuit comprising:
a semiconductor structure, the semiconductor structure comprising
a first vertical field-effect transistor comprising a first threshold voltage; and
at least a second vertical field-effect transistor comprising a second threshold voltage that is different from the first threshold voltage,
wherein each of the first vertical field-effect transistor and the second vertical field-effect transistor comprises
a source layer and a drain layer, wherein each drain layer is formed in a region of the first vertical field-effect transistor and second vertical field-effect transistor, respectively, above the source layer,
substrate in contact with the source layer,
a first spacer layer on the source layer,
a second spacer layer, where a portion of the drain layer extends over the second spacer, and
metal gate in contact with sidewalls of the epitaxially grown channel layer, a top surface of the first spacer layer, and a bottom surface of the second spacer layer.

11. The integrated circuit of claim 10, wherein each of the first and second vertical field-effect transistors further comprises a counter-doped layer in contact with the substrate.

12. The integrated circuit of claim 10, wherein the first vertical field-effect transistor comprises an epitaxially grown channel layer with a first doping concentration, and wherein the second vertical field-effect transistor comprises an epitaxially grown channel layer with a second doping concentration that is different than the first doping concentration.

13. The integrated circuit of claim 10, wherein the epitaxially grown channel layer of each of the first and second vertical field-effect transistors comprises a narrowed portion above a bottom surface of the second spacer layer that extends above a top surface of the second spacer layer.

14. The integrated circuit of claim 10, wherein for each of the first and second vertical field-effect transistors the drain layer is formed on and in contact with sidewalls of the narrowed portion of the epitaxially grown channel layer and a top surface of a portion of the epitaxially grown channel layer that is below the narrowed portion of the epitaxially grown channel layer.

15. The integrated circuit of claim 10, wherein for each of the first and second vertical field-effect transistors a portion of the drain layer extends below a top surface of the second spacer layer.

16. The integrated circuit of claim 10, wherein each of the first and second vertical field-effect transistors further comprises a dielectric material in contact with at least the layer.

17. The integrated circuit of claim 16, wherein each of the first and second vertical field-effect transistors further comprises a metal gate in contact with the dielectric layer.

* * * * *